(12) United States Patent
Miura

(10) Patent No.: US 9,307,585 B2
(45) Date of Patent: Apr. 5, 2016

(54) ORGANIC ELECTROLUMINESCENCE MODULE AND ORGANIC-ELECTROLUMINESCENCE-MODULE FEEDING STRUCTURE

(71) Applicant: KANEKA CORPORATION, Osaka-shi, Osaka (JP)

(72) Inventor: Nobuhito Miura, Otsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/394,055

(22) PCT Filed: Apr. 5, 2013

(86) PCT No.: PCT/JP2013/060491
§ 371 (c)(1),
(2) Date: Oct. 10, 2014

(87) PCT Pub. No.: WO2013/154047
PCT Pub. Date: Oct. 17, 2013

(65) Prior Publication Data
US 2015/0137710 A1 May 21, 2015

(30) Foreign Application Priority Data

Apr. 13, 2012  (JP) ................................. 2012-092479

(51) Int. Cl.
*H05B 33/06* (2006.01)
*F21V 23/06* (2006.01)
*F21S 2/00* (2006.01)
(Continued)

(52) U.S. Cl.
CPC ................ *H05B 33/06* (2013.01); *F21S 2/005* (2013.01); *F21V 19/00* (2013.01); *F21V 23/06* (2013.01);
(Continued)

(58) Field of Classification Search
CPC ........................... H05B 33/06; H05B 33/0896

USPC .......................................................... 315/312
See application file for complete search history.

(56) References Cited

U.S. PATENT DOCUMENTS

2005/0248935 A1* 11/2005 Strip et al. ..................... 362/145
2013/0306952 A1* 11/2013 Yamae ............................ 257/40
(Continued)

FOREIGN PATENT DOCUMENTS

| JP | 2007005257 A | 1/2007 |
| JP | 2007536708 A | 12/2007 |
| JP | 2011243461 A | 12/2011 |

OTHER PUBLICATIONS

ISA Japanese Patent Office, International Search Report of PCT/JP2013/060491, Jul. 16, 2013, 3 pages.
International Bureau of WIPO, International Preliminary Report on Patentability Issued in Application No. PCT/JP2013/060491, Oct. 23, 2014, 11 pages.

*Primary Examiner* — Don Le
(74) *Attorney, Agent, or Firm* — Alleman Hall McCoy Russell & Tuttle LLP

(57) ABSTRACT

One aspect of the present invention provides an organic EL module that can easily change a layout according to an installation environment while a characteristic of the organic EL module is taken advantage of. The organic EL module includes: an organic EL device in which a first electrode layer, a functional layer, and a second electrode layer are stacked on a substrate having a planar expanse, at least one of planes of the organic EL device constituting a light emitting surface; and at least three connector units that are arranged on a back side of the light emitting surface. At this point, the connector unit is arranged with a planar expanse, the connector unit includes feeding terminals, and the feeding terminals are electrically connected in parallel to one another and electrically connected to the first electrode layer or the second electrode layer.

19 Claims, 30 Drawing Sheets

(51) Int. Cl.
*F21V 19/00* (2006.01)
*H01L 51/52* (2006.01)
*F21Y 105/00* (2006.01)

(52) U.S. Cl.
CPC ...... *F21Y 2105/006* (2013.01); *F21Y 2105/008* (2013.01); *H01L 51/5203* (2013.01); *H01L 2251/5361* (2013.01)

(56) References Cited

U.S. PATENT DOCUMENTS

2013/0335940 A1* 12/2013 Matsui et al. ................. 361/783
2015/0034931 A1*  2/2015 Matsuda ......................... 257/40

* cited by examiner

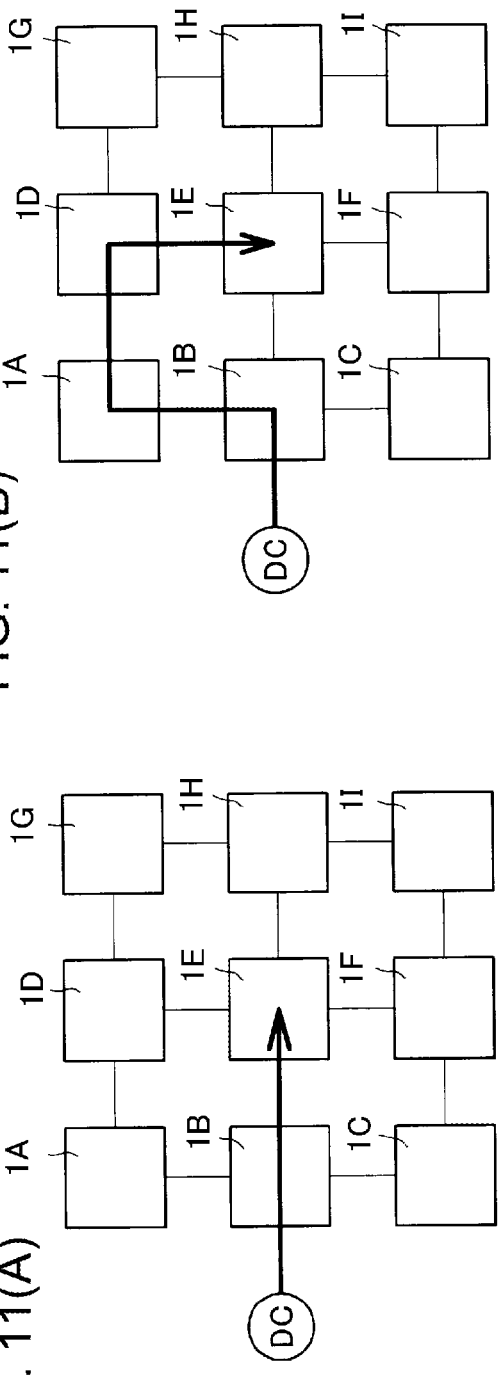
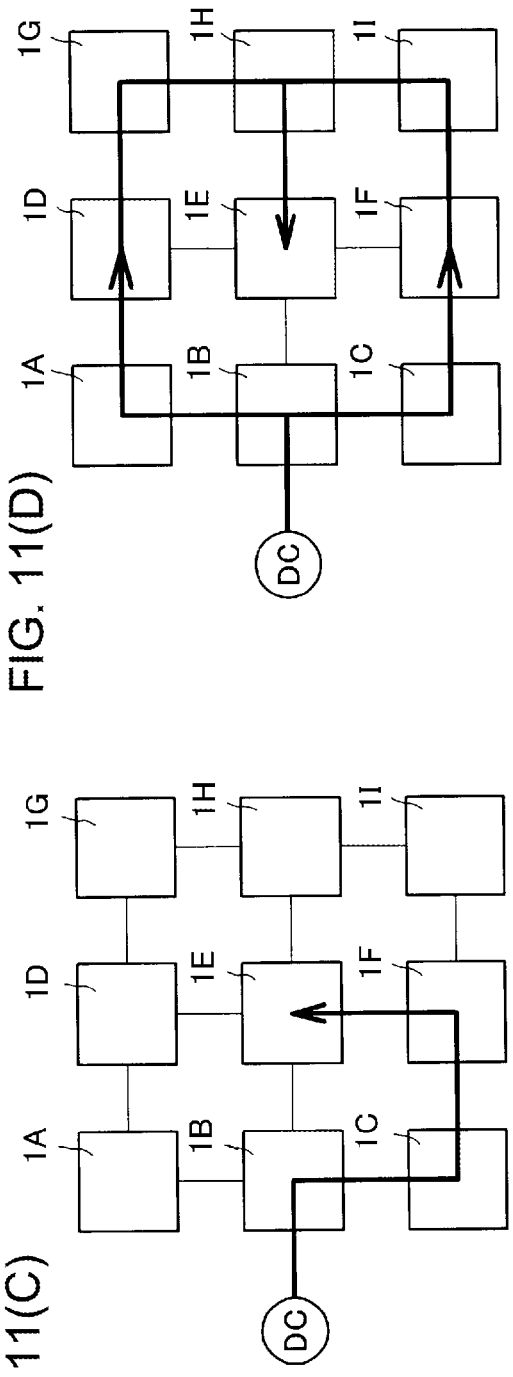
FIG. 11(A)
FIG. 11(B)
FIG. 11(C)
FIG. 11(D)

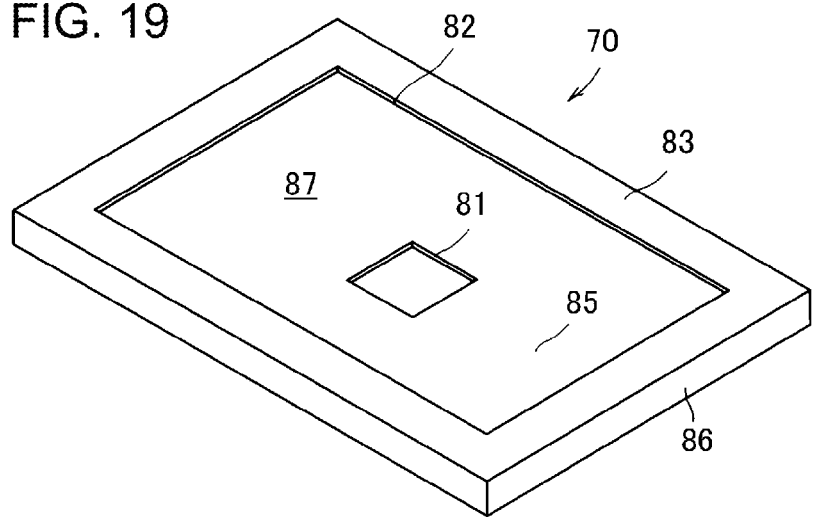
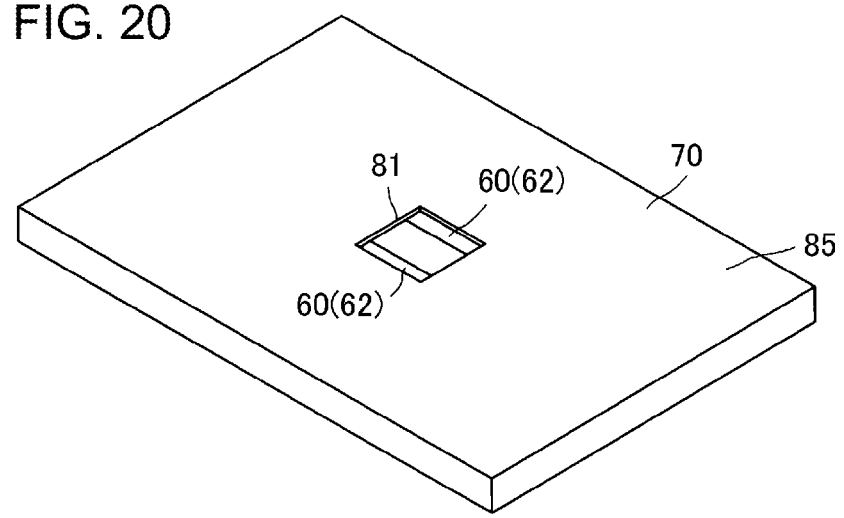

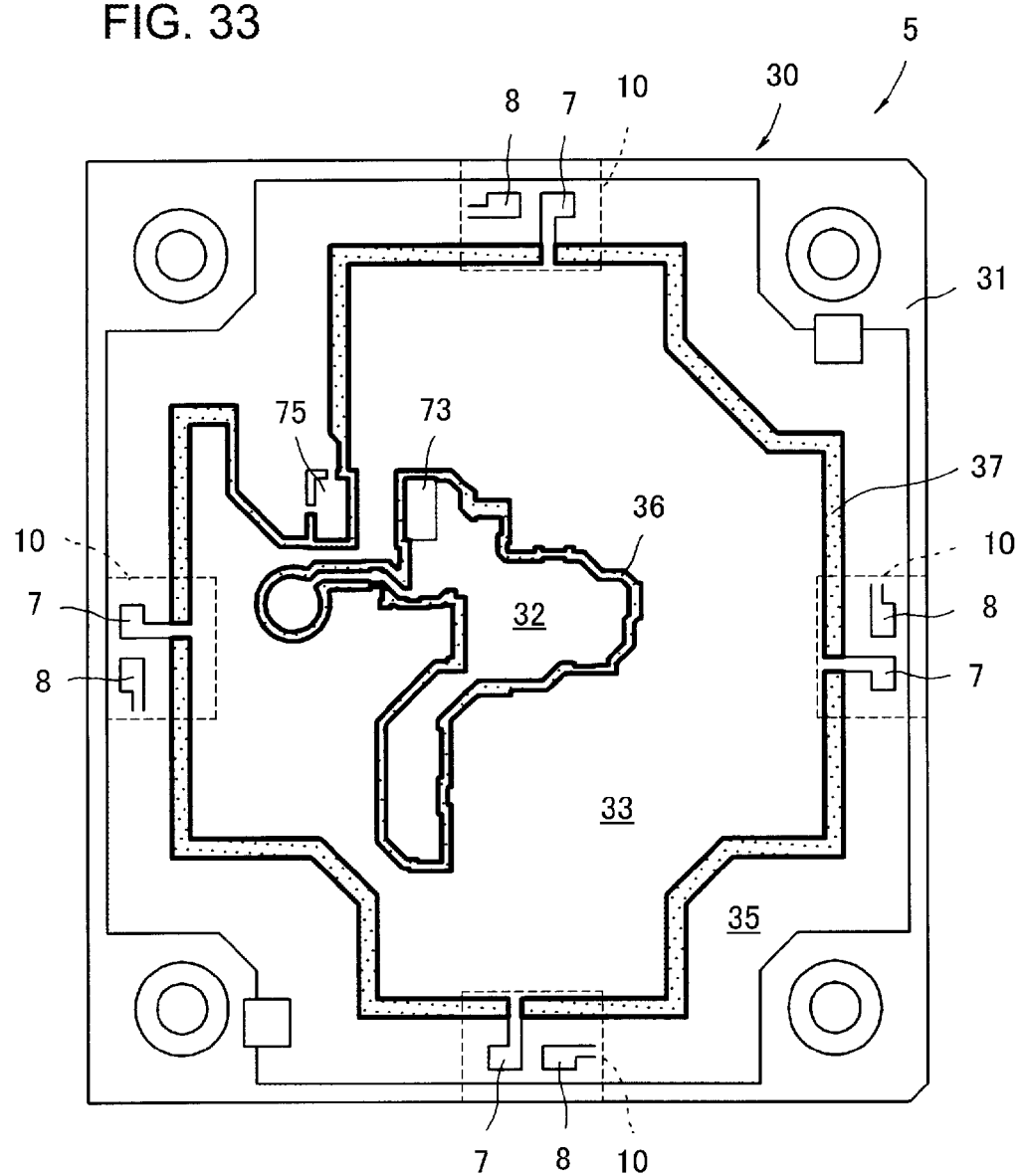

ORGANIC ELECTROLUMINESCENCE MODULE AND ORGANIC-ELECTROLUMINESCENCE-MODULE FEEDING STRUCTURE

TECHNICAL FIELD

The present invention relates to an organic EL (Electro Luminescence) module used mainly in lighting. The present invention also relates to an organic-EL-module feeding structure.

BACKGROUND ART

Nowadays, the organic EL module attracts attention as the lighting device replacing an incandescent lamp and a fluorescent lamp, and many studies are made on the organic EL module.

At this point, in the organic EL module, an organic EL device is sealed or cased. In the organic EL device, the organic EL element is stacked on substrates such as a glass substrate, a transparent resin film, and a metallic sheet, and a feeding structure is formed in order to feed power to the organic EL element.

In the organic EL element, two electrodes in which one or both the electrodes have translucency are opposed to each other, and a light emitting layer made of an organic compound is stacked between the electrodes. The organic EL device emits light by energy of recombination of an electron and a hole that are electrically excited.

That is, the organic EL module is a self-luminous device, and the organic EL module can emit the light having various wavelengths by properly selecting a material for the light emitting layer.

The organic EL module is extremely thin and light compared with the incandescent lamp, the fluorescent lamp, and an LED lighting device, and the organic EL module emits the light in a planar manner. Therefore, the organic EL module has a characteristic that there is a small constraint on an installation place. Additionally, because the organic EL module has high emission efficiency compared with the incandescent lamp and the fluorescent lamp, the organic EL module also has characteristics of low power consumption and little heat generation.

In order that the organic EL module emits the light, similarly to the incandescent lamp, the fluorescent lamp, and the LED lighting device, it is necessary to feed the power from an external power supply to apply a voltage between the two electrodes in the organic EL device.

In a lighting device proposed by Patent Document 1, a protrusion terminal is attached to an electric wire connected to a DC power supply, and the protrusion terminal is connected to the organic EL module. In the lighting device, the protrusion terminal is provided at a position corresponding to the organic EL module, and the protrusion terminal is electrically connected to the electrode in the organic EL module, whereby the organic EL modules are linearly laid without gaps to successfully emit the light similarly to a point light-emitting LED lighting device.

PRIOR ART DOCUMENT

Patent Document

Patent Document 1: JP 2007-5257 A

DISCLOSURE OF INVENTION

Technical Problem

In the feeding structure of the lighting device of Patent Document 1, it is necessary to exactly design a length of the electric wire and a distance between the protrusion terminals in advance, according to an installation environment (such as a power-supply position and an installation position) before the organic EL module is attached. Therefore even if necessity of a layout change arises due to renovation or redecoration, the layout can only be changed according to the existing feeding structure. Therefore, in the arrangement of the organic EL modules being changed, unfortunately the characteristic that there is the small constraint on the installation place is lacked in the organic EL module.

Additionally, in the case where the organic EL module is added according to the layout change, the feeding structure of Patent Document 1 has a problem in that the new organic EL module cannot be added when the organic EL modules are connected to all the protrusion terminals connected to the electric wire.

The present invention therefore aims to provide an organic EL module that can easily change the layout according to the installation environment while the characteristic of the organic EL module is taken advantage of. The present invention also aims to provide a feeding structure in which the organic EL module is used.

Solution to Problem

According to a first aspect of the present invention, an organic EL module includes: an organic EL device in which at least one of planes constitutes a light emitting surface; and at least three connector units that are arranged on a back side of the light emitting surface. At this point, two electrode layers and an organic light emitting layer sandwiched between the electrode layers are stacked on a substrate having a planar expanse in the organic EL device, the connector units are arranged with a planar expanse, each of the connector units includes at least a feeding terminal, and the feeding terminals are electrically connected in parallel to one another and electrically connected to the two electrode layers.

In the first aspect, the connector unit are arranged with the planar expanse. That is, at least the three connector units are not linearly arranged. In the first aspect, the feeding terminals of each connector unit are electrically connected in parallel to each other, and electrically connected to the electrode layer in the organic EL device. Even if the external power supply is electrically connected to the feeding terminals of any one of the connector units, the voltage can be applied between the electrode layers of the organic EL device, and the organic light emitting layer can emit the light.

Additionally, because the organic light emitting layer can emit the light even if the external power supply is electrically connected to the feeding terminals of any one of the connector units, the connector unit to which the external power supply is connected can be selected according to the installation situation of the organic EL module. Therefore, when the layout is changed, the suitably-connectable connector unit can be selected according to the desired layout. That is, the organic EL module of the first aspect can flexibly meet with the layout change, and there is a small constraint on the installation place of the organic EL module.

In the first aspect, the feeding terminals of the connector units are electrically connected in parallel to each other. For example, the external power supply is connected to the feeding terminals of one connector unit, and the feeding terminals of another connector unit and the feeding terminals of the connector unit of another organic EL module are electrically connected to each other, which allows power to be supplied from the external power supply to another organic EL module via the organic EL module. That is, the organic EL module of the first aspect also serves as part of the feeding wiring that connects the feeding terminals. Therefore, the plurality of organic EL modules can emit the light using one external power supply, necessity of the extra wiring can be eliminated to reduce cost.

Even in the case where the new organic EL module is added to the existing organic EL module, because the organic EL module of the first aspect acts as part of the feeding wiring that connects the feeding terminals, it is not necessary to newly provide the feeding terminal for the organic EL module according to the position at which the organic EL module is added. Therefore, the new organic EL module can be added irrespective of the number of feeding terminals. Accordingly, in the first aspect, the new organic EL module can easily be added.

In the case where the organic EL module is used as a lighting device, because the organic EL module can emit the light in the planar manner as described above, frequently the plural organic EL modules are laid without gaps with the planar expanse on a wall surface such as a ceiling unlike the point light-emitting LED lighting device. In such cases, unlike the point light-emitting LED lighting device, in order to evenly emit the light on the whole surface, the plurality of organic EL modules are suitably installed such that the gap between the organic EL modules adjacent to each other is eliminated as much as possible and such that an interval between the light emitting surfaces of the organic EL module is reduced.

Preferably the organic EL module of the first aspect includes a base member that includes the connector unit. At this point, the base member has a shape in which the base members can be laid without gaps with a planar expanse, and the same number of connector units as other adjacent organic EL modules are provided when the connector units are laid without gaps.

As used herein, the term "the base members can be laid without gaps" means that the base members can be laid with no substantial gap when the base members are arranged.

The term "with no substantial gap" includes a state in which the gap exists negligibly small in addition to a state in which no gap exists. Specifically, the term "with no substantial gap" includes a state in which the gap of several millimeters exists.

Accordingly, the base member has the shape in which the base members can be laid without gaps with a planar expanse, and the same number of connector units as other adjacent organic EL modules are provided when the base members are laid without gaps, so that the organic EL modules can be installed while the interval between the light emitting surface of the organic EL module and the light emitting surface of another adjacent organic EL module is reduced. The number of feeding terminals of the connector unit is not lacked during the connection.

Preferably the base member has a polygonal shape in a planar view, and the connector unit is arranged according to each side of the polygonal shape.

Accordingly, the organic EL module is easily connected to another organic EL module.

Preferably the base member is arranged on a projection plane in a member thickness direction of the organic EL device.

Preferably the organic EL module includes: a split flow pathway that splits a current supplied from one of the connector units when the current is supplied to the one of the connector units; and a self conductive pathway through which the current is supplied to the self organic EL device.

Accordingly, in the organic EL module, not only the self organic EL device emits the light by supplying the current to one of the connector units, but also the current can be passed through the wiring connected to other connector units.

Further preferably the organic EL module includes a plurality of split flow pathways.

Preferably the organic EL module includes a mounting unit that has a circuit structure. At this point, the circuit structure includes a mounting circuit and a connector-side connecting wiring that electrically connects the mounting circuit and the connector unit, and the connector-side connecting wiring has a planar expanse.

Accordingly, the connector-side connecting wiring that connects the mounting circuit and the connector unit has the planar expanse. That is, because the connector-side connecting wiring has certain widths, the disconnection hardly occurs compared with the conventional linear wiring.

Preferably the organic EL module includes: a base member that fixes the organic EL device to an attaching target surface, the base member including a current carrying terminal on a side of the light emitting surface, the current carrying terminal being electrically connected to the organic EL device and the two electrode layers; and a mounting unit that has a circuit structure, the circuit structure including a mounting circuit and a current-carrying-terminal-side connecting wiring that electrically connects the mounting circuit and the current carrying terminal. At this point, the current-carrying-terminal-side connecting wiring has a planar expanse.

Accordingly, the current-carrying-terminal-side connecting wiring that connects the mounting circuit and the current carrying terminal has the planar expanse. That is, because the current-carrying-terminal-side connecting wiring has certain widths, the disconnection hardly occurs compared with the conventional linear wiring.

Preferably the organic EL module includes a base member. At this point, the base member includes a mounting unit and a main body unit on which the mounting unit is placed, the mounting unit is constructed with a circuit board and a circuit unit, the circuit unit concentrates on a side of one of principal surfaces of the circuit board, and one of the principal surfaces of the circuit board is opposed to the main body unit.

Accordingly, a user can be prevented from getting an electric shock caused by touching the circuit unit during installation. Therefore, the organic EL module has excellent safety.

Further preferably the main body unit and the circuit board are arranged with a predetermined space, and the circuit unit is accommodated in the predetermined space.

Accordingly, because the circuit unit is accommodated in the predetermined space, the circuit unit is not compressed, but a short-circuit is hardly generated.

Particularly preferably the connector unit is provided on a surface on a side opposite to one of the principal surfaces of the circuit board.

Accordingly, the wiring is easily connected to the connector unit.

Preferably the organic EL device includes a feeding unit that is electrically connected to the two electrode layers, and the feeding unit is formed near a side or an arc of the substrate of the organic EL device.

As used herein, the term "near a side or an arc" means a region ranging from 0 percent to 10 percent of one side or a diameter of the substrate. The region suitably ranges from 0 percent to 5 percent of the one side or the diameter of the substrate.

Accordingly, because the feeding unit is formed near the side or the arc of the substrate of the organic EL device, the feeding unit does not obstruct the emission of the light emitting surface during operation.

Preferably the organic EL device includes: at least two feeding units that are electrically connected to one of the two electrode layers; and a conductive member that electrically connects the organic EL device and the connector unit, and the conductive member connects at least the two feeding units to each other.

Accordingly, because the conductive member is connected to the two feeding units, the power can be fed to the organic EL device even if one of the feeding units is broken.

Preferably the substrate has a polygonal shape, and the two feeding units are arranged near one side and an opposite side of the substrate.

As used herein, the term "near one side and an opposite side" means an region ranging from 0 percent to 10 percent of the one side or the diameter of the substrate. The region suitably ranges from 0 percent to 5 percent of the one side or the diameter of the substrate.

Accordingly, the feeding units are provided in the one side and the opposite side, respectively, so that the current can thoroughly be passed through the light emitting surface in a direction in which the one side and the opposite side are connected to each other. Therefore, unevenness of the light emission is hardly generated.

Preferably, in the conductive member, a plurality of conductive foils are arranged in a planar manner, and resin films having insulating properties are provided on both sides of the plurality of conductive foils.

Accordingly, in the conductive member, the plurality of conductive foils are arranged in the planar manner, and the resin films having the insulating properties are provided on both the sides of the plural conductive foils, so that the thickness is hardly increased when the feeding unit of the organic EL device is electrically connected to the connector unit. Therefore, the characteristic of the thin organic EL module is hardly lacked.

Preferably at least one conductive foil is electrically connected to one of the two electrode layers of the organic EL device, and at least one conductive foil is electrically connected to the other of the two electrode layers of the organic EL device.

Accordingly, the power can independently be fed from the feeding unit of the organic EL device to each electrode layer by the corresponding conductive foil.

Some of general lighting devices such as a pendant lighting device have a structure in which the power is supplied from the center to the lighting device to emit the light. In such cases, in order that the organic EL module is used as the lighting device, it is necessary to include a feeding structure in which the power can intensively be fed from the center.

Preferably the conductive member includes a current carrying region where the plurality of conductive foils are exposed from the resin film on one side, and the current carrying region is located in a center of the conductive member.

Accordingly, the power can be fed to the feeding unit located at an end of the organic EL device via the current carrying region in the center of the conductive member. Therefore, the power can intensively be fed from the center.

Preferably the conductive member is placed on a surface on a side opposite to the light emitting surface of the organic EL device, and traverses the surface on the side opposite to the light emitting surface.

Preferably the organic EL device includes a light emitting region that actually emits light during operation when the substrate is viewed in a planar manner, the conductive member includes a cyclic unit that surrounds the light emitting region of the organic EL device and a connecting unit that extends from the cyclic unit into the light emitting region, the cyclic unit is connected to each feeding unit, the connecting unit includes a terminal unit that is directly or indirectly connected to the base member in the light emitting region, and the organic EL device and the connector unit are electrically connected to each other via the terminal unit.

Accordingly, the power is fed from the connecting unit extending in the light emitting region to each feeding unit via the cyclic unit, so that the power can intensively be fed from the center side.

Preferably the terminal unit is located near a leading end in an extending direction of the connecting unit, and located in the center of the light emitting region.

Preferably the organic EL module includes a sheet-like or plate-like heat equalizing member having heat conductivity, the heat equalizing member covering the whole light emitting region of the organic EL device.

Accordingly, the whole light emitting region of the organic EL device is covered with the heat equalizing member having heat conductivity, so that a heat distribution can be equalized on the light emitting surface. Therefore, unevenness of luminance can be constrained.

Preferably the cyclic unit surrounds the heat equalizing member with a predetermined gap.

Preferably the organic EL module includes a buffer plate that covers the whole light emitting region of the organic EL device, the buffer plate relaxing a pressure applied onto the organic EL device side.

Accordingly, because the pressure applied onto the organic EL device side can be relaxed by the buffer plate, each layer in the organic EL device is hardly compressed, and the short-circuit hardly occurs.

Preferably the buffer plate is interposed between the connecting unit and the organic EL device.

Accordingly, a pressing force generated by the connecting unit located on the organic EL device can be relaxed by the buffer plate.

Further preferably the organic EL device includes a feeding unit that is electrically connected to the two electrode layers, the cyclic unit includes a ground unit that is electrically connected to the terminal unit, and the ground unit is directly or indirectly connected to the feeding unit.

Preferably the organic EL module includes: a conductive member that electrically connects the organic EL device and the connector unit; and a frame body that can be attached to the organic EL device, the frame body unifying the conductive member and the organic EL device.

Accordingly, the conductive member and the organic EL device are hardly separated from each other because the conductive member and the organic EL device can be unified by rigidity of the frame body.

Preferably the frame body includes a latching piece that can engage the base member.

Accordingly, the organic EL device is easily attached to the base member because the frame body can be latched in the base member by the latching piece.

Preferably the frame body includes an organic-EL-element-side covering unit that covers a surface on a side opposite to the light emitting surface of the organic EL device, the organic-EL-element-side covering unit includes a through-hole that penetrates the organic-EL-element-side covering unit in a member thickness direction, and the conductive member passes through an opening on the connector side of the through-hole.

Accordingly, the power can easily be fed from the outside of the frame body.

According to a second aspect of the present invention, an organic EL module includes: an organic EL device in which two electrode layers and an organic light emitting layer sandwiched between the electrode layers are stacked on a substrate having a planar expanse, at least one of planes of the organic EL device constituting a light emitting surface; at least three connector units that are arranged on a back side of the light emitting surface; and a mounting unit that has a circuit structure, the circuit structure including a mounting circuit and a connector-side connecting wiring that electrically connects the mounting circuit and the connector unit, the connector side connecting wiring having a planar expanse.

According to a third aspect of the present invention, an organic EL module includes: an organic EL device in which two electrode layers and an organic light emitting layer sandwiched between the electrode layers are stacked on a substrate having a planar expanse, at least one of planes of the organic EL device constituting a light emitting surface; at least three connector units that are arranged on a back side of the light emitting surface. At this point, the organic EL device includes at least the two feeding units that are electrically connected to one of the two electrode layers, and a conductive member that electrically connects the organic EL device and the connector unit is provided, the conductive member connecting two feeding units.

According to a fourth aspect of the present invention, an organic EL module includes: an organic EL device in which two electrode layers and an organic light emitting layer sandwiched between the electrode layers are stacked on a substrate having a planar expanse, at least one of planes of the organic EL device constituting a light emitting surface; and at least three connector units that are arranged on a back side of the light emitting surface. At this point, the organic EL device includes a light emitting region that actually emits light during operation when the substrate is viewed in a planar manner, the organic EL device includes at least two feeding units that are electrically connected to one of the two electrode layers, a conductive member that electrically connects a feeding unit of the organic EL device and the connector unit is provided, the conductive member includes a cyclic unit that surrounds a light emitting region of the organic EL device and a connecting unit that extends from the cyclic unit into the light emitting region, the cyclic unit is connected to each feeding unit, the connecting unit includes a terminal unit that is directly or indirectly connected to a base member in the light emitting region, and the organic EL device and the connector unit are electrically connected to each other via the terminal unit.

According to a fifth aspect of the present invention, an organic-EL-module feeding structure includes: at least the three organic EL modules of the first to fourth aspects; and a connecting member that electrically connects connector units of the organic EL modules. At this point, at least two closed circuits passing through an external power supply, a connecting member, and an organic EL device having a load of an organic light emitting layer are formed between the organic EL modules.

Accordingly, the closed circuit including the external power supply, the connecting member that electrically connects the organic EL module connected to the external power supply and another organic EL module, and the organic EL device in another organic EL module is formed in each organic EL module except the organic EL module electrically connected to the external power supply. Therefore, the current can be passed from one external power supply to the plural organic EL modules to emit the light.

Preferably the base members of at least the three organic EL modules are arranged so as to be densely laid with a planar expanse.

As used herein, the term "be densely laid with a planar expanse" means a state in which the base members having one or plural kinds of shapes are laid without gaps. There is no limitation to the shape of the base member. For example, only the quadrangular base members may be laid without gaps, or the triangular base members and the hexagonal base member may be laid without gaps in combination.

Accordingly, the organic EL modules can be laid without gaps.

Preferably the two closed circuits pass through the different organic EL modules.

Preferably one of the organic EL modules forms a first closed circuit passing through the organic EL device having the load of the self organic light emitting layer and a second closed circuit passing through the organic EL device having the load of the organic light emitting layer of another organic EL module.

Accordingly, at least the two organic EL modules can simultaneously emit the light.

Preferably the organic-EL-module feeding structure includes plural feeding pathways through which power is fed from the external power supply to one of the organic EL modules.

Effect of Invention

According to the organic EL module of the present invention and the feeding structure thereof, the connector units are arranged with a planar expanse, and some of the connector units are electrically connected in parallel to one another and electrically connected to the two electrode layers in the organic EL device, so that the layout can easily be changed according to the installation environment.

BRIEF DESCRIPTION THE DRAWINGS

FIG. 2A is an electric circuit diagram corresponding to an actual positional relationship, and FIG. 2B is an electric circuit diagram in which FIG. 2A is simplified.

FIGS. 11A to 11D are explanatory and schematical views each illustrating a feeding pathway to the organic-EL-module of the organic-EL-module feeding structure in FIG. 10, and expressing the current flow by an arrow.

FIG. 19 is a perspective view of a frame body in FIG. 15 when the frame body is viewed from another direction (lower side).

FIG. 20 is a perspective view in which the organic EL device, conductive member, and frame body in FIG. 15 are assembled.

FIG. 33 is an explanatory view illustrating an insulating region of the circuit board in FIG. 29, and expressing the insulating region by dots.

MODES FOR CARRYING OUT INVENTION

Figure 1:
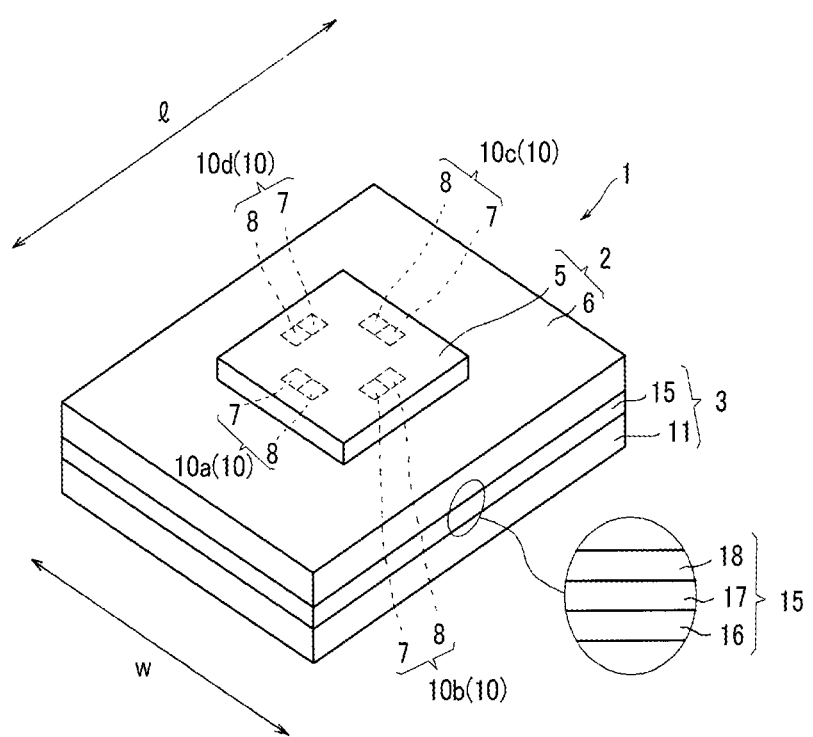
FIG. 1 is a perspective view conceptually illustrating an organic EL module according to a first embodiment of the present invention.

A first embodiment of the present invention will be described in detail below. Hereinafter, unless otherwise noted, a positional relationship among the right, left, top, and bottom of an organic EL module 1 is described based on a posture in FIG. 1. That is, it is assumed that a side of a substrate 11 is a lower side while a side of a mounting unit 5 is an upper side. For the sake of easy understanding, the drawing are exaggerated compared with an actual size (a length, a width, and a thickness).

The organic EL module 1 is suitably used mainly as a lighting device. As illustrated in FIG. 1, the organic EL module 1 is constructed with a connecting plate 2 (base member) including plural connector units 10 and an organic EL device 3. A light emitting surface 53 (see FIG. 14) of the organic EL device 3 can emit light by electrically connecting an external power supply to the connector units 10 of the connecting plate 2, and the organic EL module 1 serves as the lighting device.

Each member constituting the organic EL module 1 will be described below.

As illustrated in FIG. 1, the connecting plate 2 is constructed with a fixed unit 6 and a mounting unit 5.

The fixed unit 6 having a planar expanse includes at least three sides. That is, the fixed unit 6 has a polygonal shape. In the first embodiment, the fixed unit 6 has a square shape, and includes four sides. In other words, each two sides opposed to each other exist in the fixed unit 6.

The mounting unit 5 includes a DC stabilizing circuit and well-known mounting components such as a dimming component, a color control component, and a signal transmission and reception component. The mounting unit 5 includes plural connector units 10 (10a, 10b, 10c, and 10d) electrically connected thereto.

In the case where the organic EL module 1 and other organic EL modules 1 are laid without gaps, the organic EL module 1 includes at least the same number of connector units 10 as other organic EL modules 1 adjacent thereto.

Hereinafter, sometimes the connector units 10a, 10b, 10c, and 10d having the similar configuration are collectively referred to as a connector unit 10.

Similarly to the fixed unit 6, the mounting unit 5 having the planar expanse includes at least three sides. That is, the mounting unit 5 has a polygonal shape. In the first embodiment, the mounting unit 5 has a square shape, and includes four sides. Each side of the mounting unit 5 is parallel to each corresponding side of the fixed unit 6.

As illustrated in FIG. 1, the mounting unit 5 is located in the center of the fixed unit 6, and each of the connector units 10a, 10b, 10c, and 10d is provided at a position corresponding to the side of the fixed unit 6 of the connecting plate 2.

Specifically, the connector unit 10a and the connector unit 10c are arranged at the positions that are opposed to each other in a lengthwise direction 1 while the center of the mounting unit 5 is interposed therebetween. On the other hand, the connector unit 10b and the connector unit 10d are arranged at the positions that are opposed to each other in a direction w (hereinafter, also referred to as a width direction w) orthogonal to the lengthwise direction 1 while the center of the mounting unit 5 is interposed therebetween.

In other words, a virtual line connecting the connector unit 10a and the connector unit 10c intersects a virtual line connecting the connector unit 10b and the connector unit 10d at the center of the mounting unit 5.

As illustrated in FIG. 1, the connector units 10a to 10d are arranged at the positions near the sides of the mounting unit 5.

Specifically, a distance from the side to each of the corresponding connector units 10a to 10d is provided within a range of ¼ or less of a short side of the mounting unit 5, and preferably the distance is provided within a range of ⅕ or less. More preferably the distance is provided near each side of the mounting unit 5, namely, within a range of ⅙ or less of the short side of the mounting unit 5.

The connector units 10a to 10d are particularly preferably provided along each side of the mounting unit 5.

Figure 2:
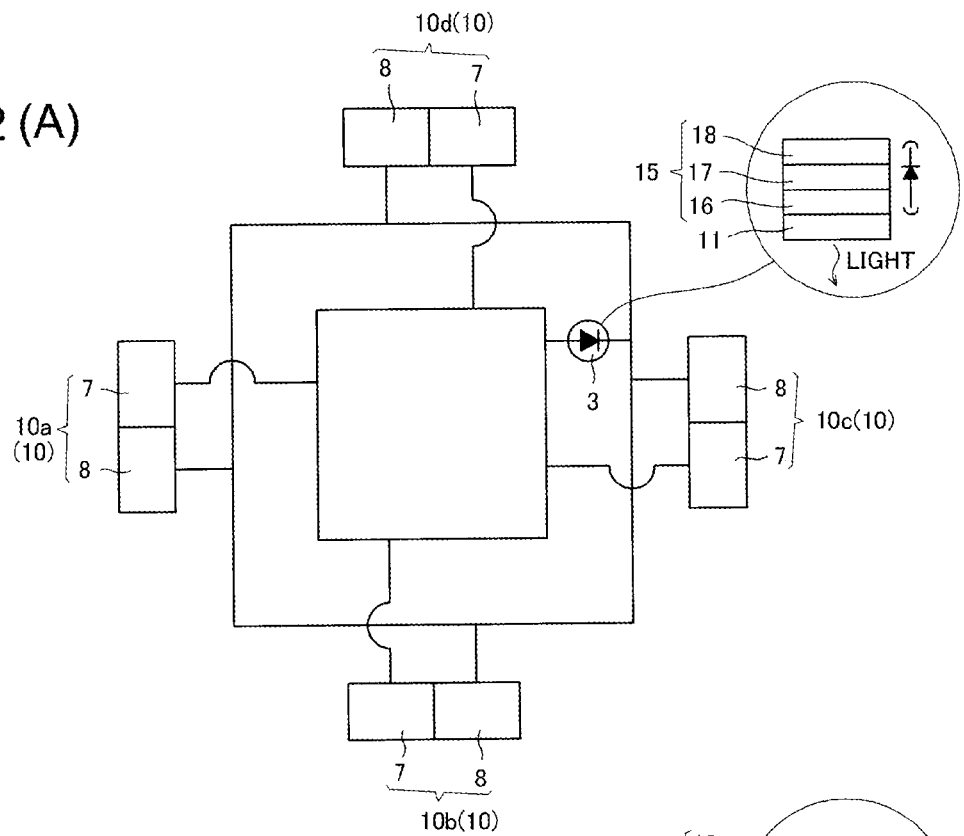
FIGS. 2A and 2B are an electric circuit diagram of the organic EL module in FIG. 1.
Figure 2:
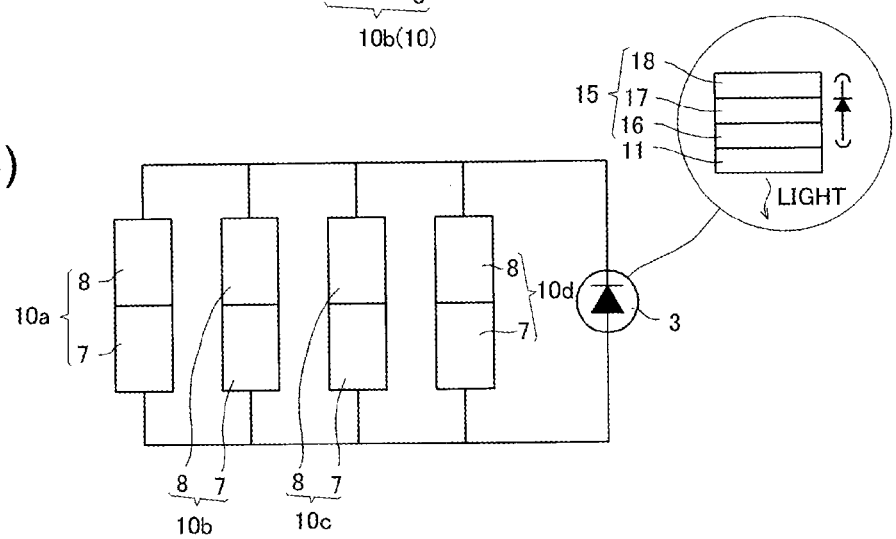

As illustrated in FIGS. 1 and 2A, the connector unit 10 includes a first feeding terminal 7 (feeding terminal) and a second feeding terminal 8 (feeding terminal).

As illustrated in FIGS. 2A and 2B, the first feeding terminal 7 is electrically connected to a first electrode layer 16 that is of an anode in the organic EL device 3 via the mounting unit 5.

The second feeding terminal 8 is electrically connected to a second electrode layer 18 that is of a cathode in the organic EL device 3 via the mounting unit 5.

Figure 3:
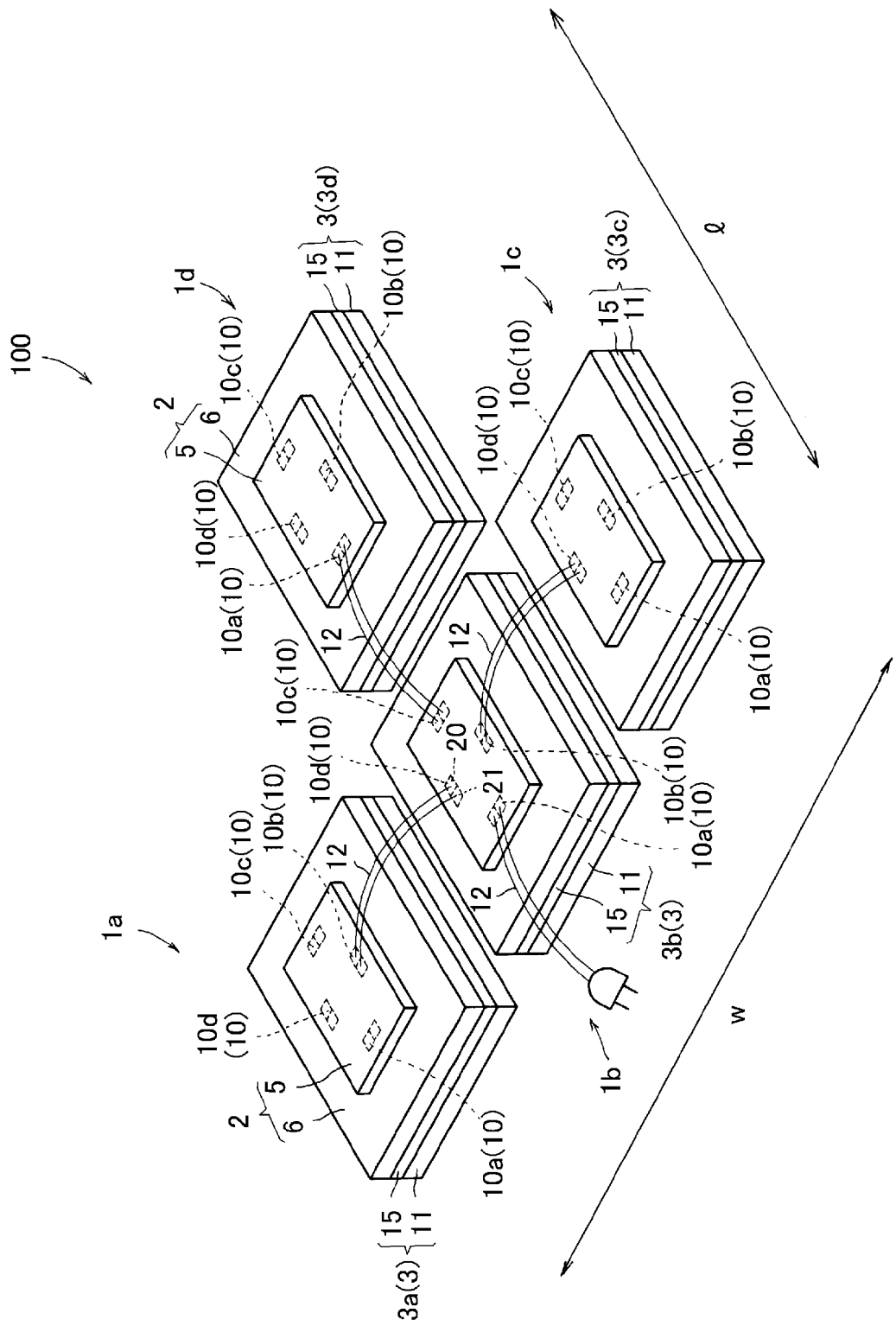
FIG. 3 is a perspective view conceptually illustrating a feeding structure in which the organic EL module in FIG. 1 is used.

As illustrated in FIG. 3, the connector unit 10 (10a, 10b, 10c, and 10d) can be electrically connected to an external power supply and a connecting member 12.

Figure 4:
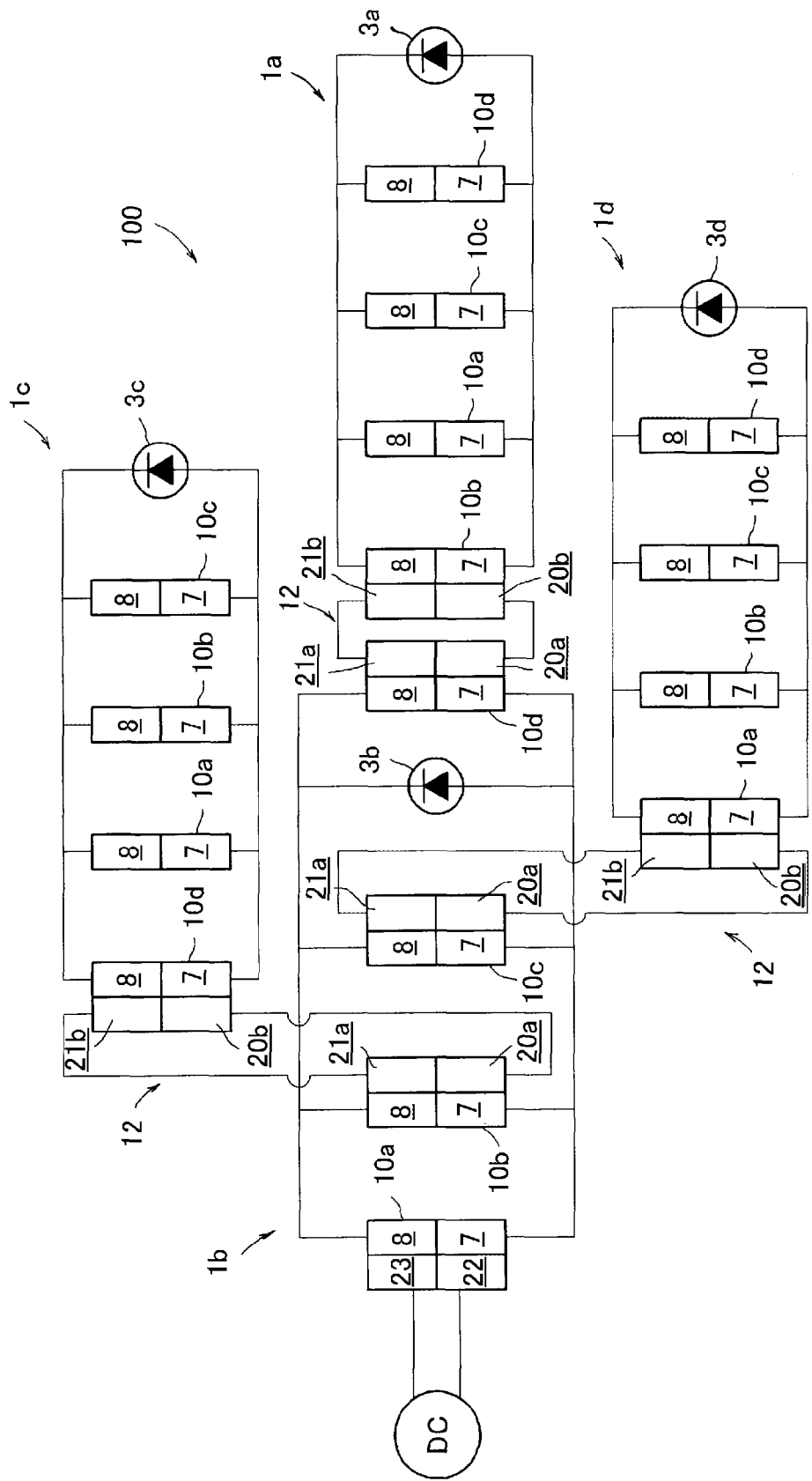
FIG. 4 is an electric circuit diagram illustrating the organic-EL-module feeding structure in FIG. 3.

Specifically, as illustrated in FIGS. 3 and 4, the first feeding terminal 7 of the connector unit 10 can be connected to a power-supply terminal 22 of the external power supply and a connecting terminal 20 (20a and 20b) of the connecting member 12. The second feeding terminal 8 of the connector unit 10 can be connected to a power-supply terminal 23 of the external power supply and a connecting terminal 21 (21a and 21b) of the connecting member 12.

As illustrated in FIG. 2B, the connector units 10a, 10b, 10c, and 10d are electrically connected in parallel to each other. The connector units 10a, 10b, 10c, and 10d are also electrically connected in parallel to the organic EL device 3. That is, each of the connector units 10a, 10b, 10c, and 10d and the organic EL device 3 form a closed circuit.

Some of organic EL modules include mounting circuits such as a stabilizing circuit that stably supplies a current to the organic EL device. Sometimes the mounting circuit is arranged on a conductive pathway between the external power supply and the organic EL device to supply the current to the organic EL device. In this case, linear thin-film wirings formed on the substrate are used in the connection between the external power supply and the mounting circuit and the connection between the mounting circuit and the organic EL device.

Therefore, there is a risk of disconnecting the wiring when an unexpected load is applied to the wiring by an external force. The disconnection of the wiring not only hinders the current from being supplied to the organic EL device, but also leads to a circuit board heat generation to cause firing when the current is continuously passed in the disconnected state.

For this reason, in order to solve the problem, a characteristic circuit structure 30 is provided in the mounting unit 5 of the organic EL module 1 of the first embodiment. The circuit structure 30 of the mounting unit 5 will be described below.

Figure 29:
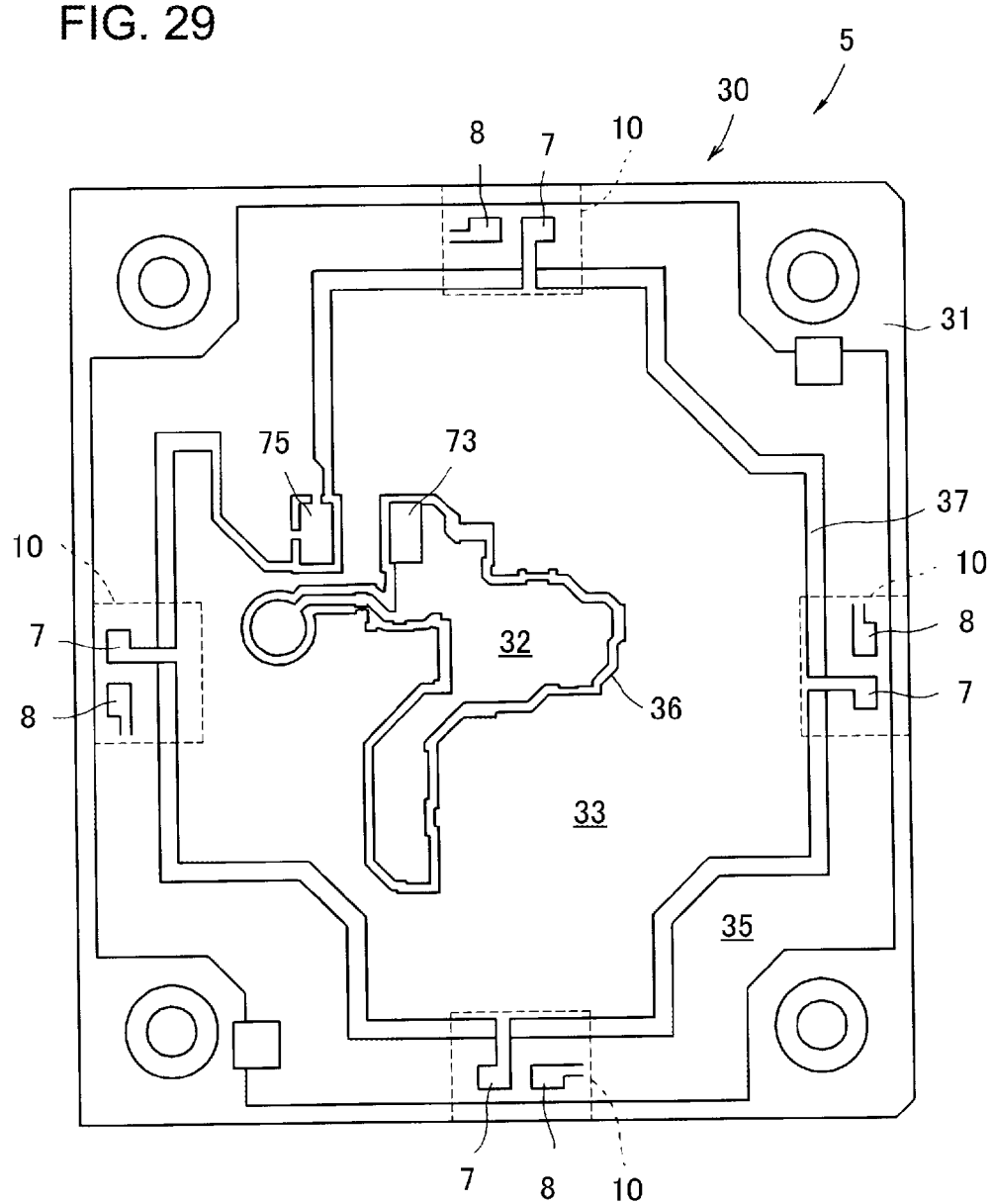
FIG. 29 is a plan view conceptually illustrating a circuit board of a mounting unit in FIG. 1.

As illustrated in FIGS. 29 and 33, the circuit structure 30 of the mounting unit 5 of the first embodiment is divided into plural regions having planar expanses by cyclic insulating regions 36 and 37 on a circuit board 31.

Figure 30:
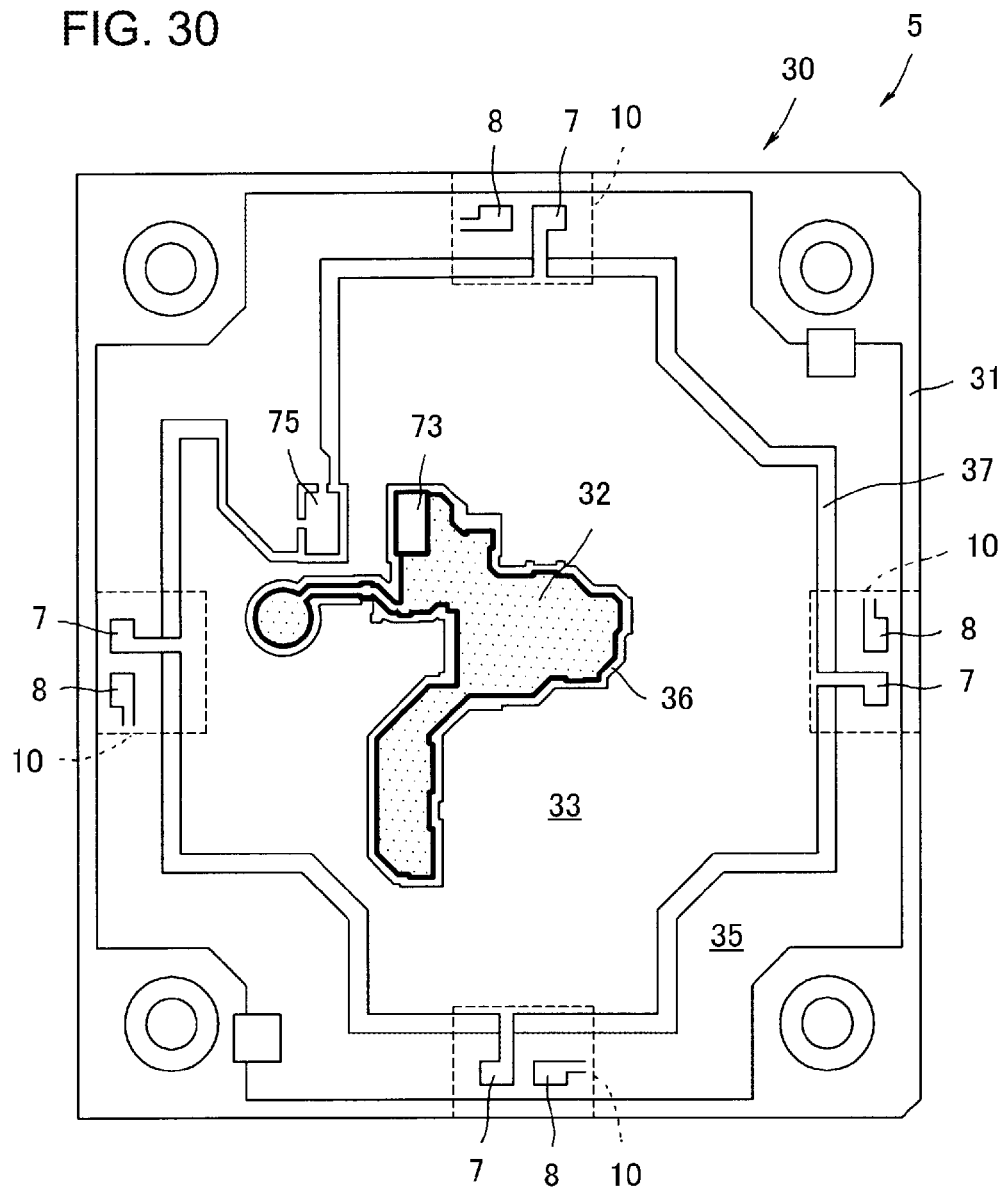
FIG. 30 is an explanatory view illustrating a circuit region of the circuit board in FIG. 29, and expressing the circuit region by dots.
Figure 31:
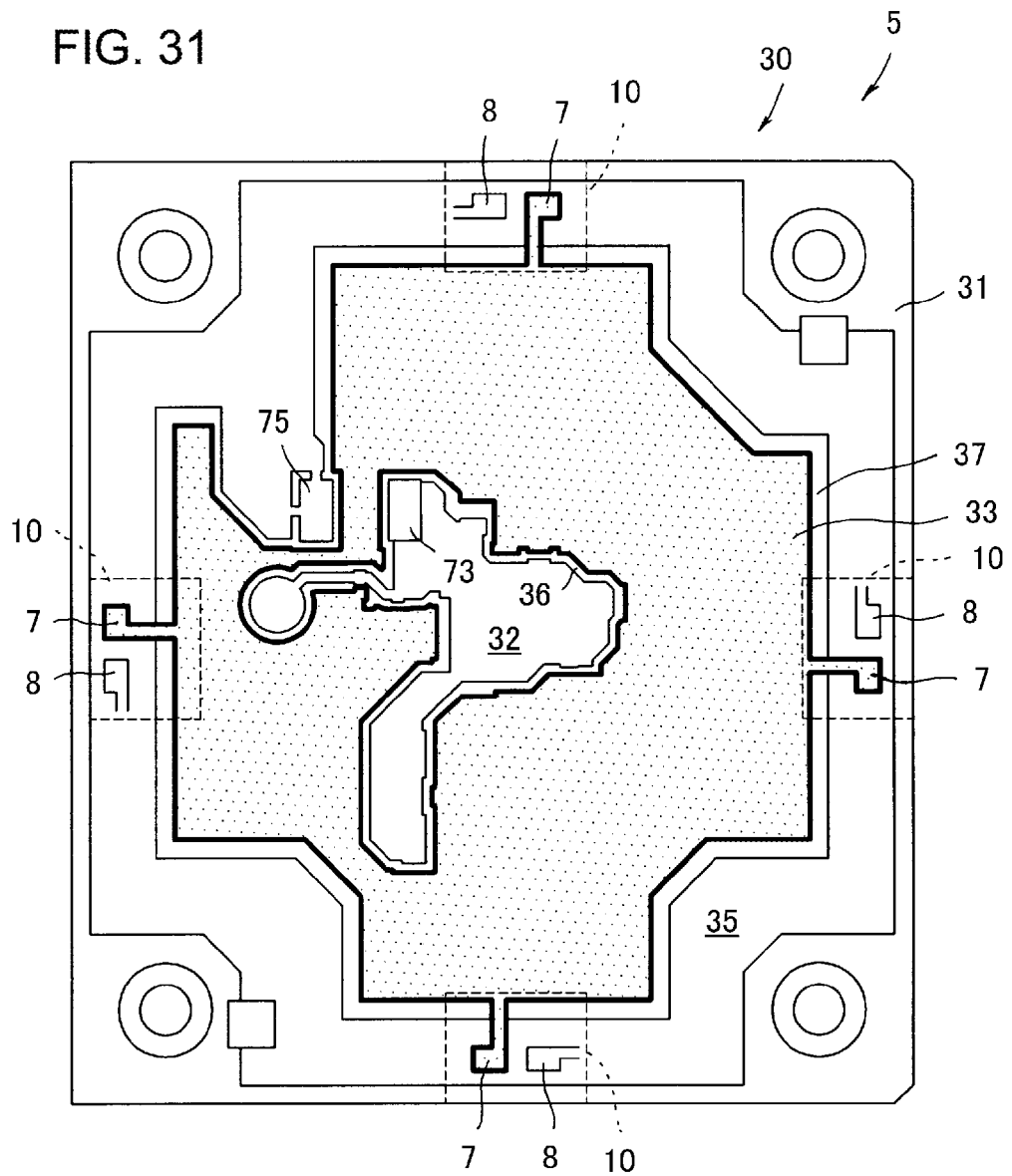
FIG. 31 is an explanatory view illustrating a positive region of the circuit board in FIG. 29, and expressing the positive region by dots.
Figure 32:
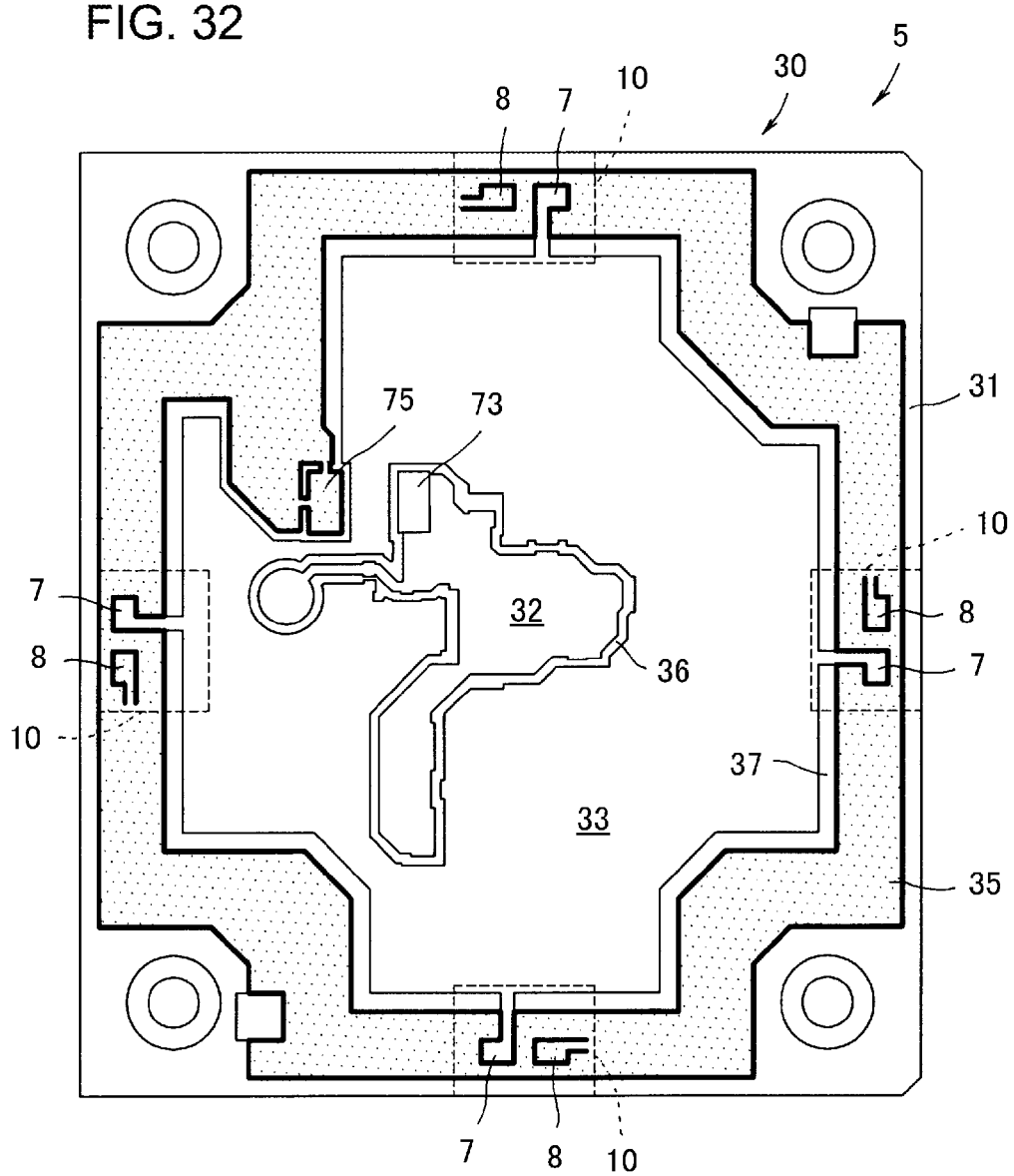
FIG. 32 is an explanatory view illustrating a negative region of the circuit board in FIG. 29, and expressing the negative region by dots.

Specifically, the circuit structure 30 includes a circuit region 32 (current-carrying-terminal-side connecting wiring) surrounded by a bold line in FIG. 30, a positive region 33 (connector-side connecting wiring) surrounded by a bold line in FIG. 31, and a negative region 35 (connector-side connecting wiring) surrounded by a bold line in FIG. 32.

The mounting circuits such as the DC stabilizing circuit are provided in the circuit region 32. As illustrated in FIG. 30, the circuit region 32 is electrically connected to the positive region 33 via an internal wiring of the circuit board 31, and a current carrying terminal 73 is located in the circuit region 32. That is, the circuit region 32 serves as the wiring connecting the mounting circuit and a terminal.

As illustrated in FIG. 31, the positive region 33 is electrically connected to the first feeding terminal 7 of the connector unit 10. The positive region 33 electrically connects the first feeding terminals 7 of the connector units 10 to one another in parallel. That is, the circuit region 33 serves as the wiring connecting the mounting circuit and the terminal.

The positive region 33 is electrically separated from the circuit region 32 by the insulating region 36 on a surface of the circuit board 31. That is, the current conduction is not established between the positive region 33 and the circuit region 32 with no use of the internal wiring of the circuit board 31 or a component of the mounting circuit.

As illustrated in FIG. 32, the negative region 35 is electrically connected to the second feeding terminal 8 of the connector unit 10. The negative region 35 electrically connects the second feeding terminals 8 of the connector units 10 to one another in parallel. That is, the negative region 35 serves as the wiring connecting the mounting circuit and the terminal.

The negative region 35 electrically separated from the positive region 33 by the insulating region 37 on the surface of the circuit board 31. That is, the current conduction is not established between the negative region 35 and the positive region 33 with no use of the internal wiring of the circuit board 31 or the component of the mounting circuit.

A current carrying terminal 75 is located in the negative region 35.

A positional relationship among the regions in the circuit structure 30 of the mounting unit 5 will be described below. In the circuit structure 30, as illustrated in FIG. 30, the circuit region 32 is located in the substantial center of the circuit board 31. In the circuit structure 30, as illustrated in FIG. 31, the positive region 33 is provided so as to surround the circuit region 32, and the insulating region 36 is interposed between the circuit region 32 and the positive region 33. The positive region 33 constitutes a cyclic region when viewed from the side thereof, and the circuit region 32 is located in the cyclic region.

As illustrated in FIG. 32, in the circuit structure 30, the negative region 35 is provided so as to surround the positive region 33, and the insulating region 37 is interposed between the positive region 33 and the negative region 35. The negative region 35 constitutes a cyclic region when viewed from the side thereof, and the positive region 33 is located in the cyclic region.

In the circuit structure 30 of the first embodiment, an amount of current per unit area can be decreased because the wiring connecting the connector unit 10 and the mounting circuit and the wiring connecting the mounting circuit and the current carrying terminals 73 and 75 have the planar expanses. Therefore, the wiring is hardly disconnected even if the unexpected load is applied to the wiring by the external force.

In the organic EL device 3, as illustrated in FIG. 1, at least an organic EL element 15 is stacked on the substrate 11 having translucency. The organic EL device 3 includes a light emitting surface 53 that actually emits the light in a plane of the organic EL element 15 during operation.

As illustrated in FIG. 1, the organic EL element 15 includes a functional layer 17 (organic light emitting layer) that actually emits the light between the first electrode layer 16 and a second electrode layer 18.

There is no particular limitation to a material for the substrate 11. For example, a flexible film or plastic substrate is properly selected as the substrate 11. Particularly, a glass substrate or a transparent film substrate is suitably used from the viewpoint of transparency or good workability.

A transparent insulating substrate having the transparency and an insulating property is used as the substrate 11 of the first embodiment. Specifically, the glass substrate is used as the substrate 11.

There is no particular limitation to a material for the first electrode layer 16. For example, metallic oxides such as indium tin oxide (ITO), indium zinc oxide (IZO), tin oxide ($SnO_2$), and zinc oxide (ZnO) and metals such as silver (Ag) and chromium (Cr) are used as the first electrode layer 16.

From the viewpoint of effectively taking out the light emitted from the organic light emitting layer in the functional layer 17, preferably a transparent conductive oxide is used as the first electrode layer 16, and particularly preferably ITO or IZO having the high transparency is used. In the first embodiment, ITO is used.

The functional layer 17 is provided between the first electrode layer 16 and the second electrode layer 18, and includes at least one organic light emitting layer. The functional layer 17 of the first embodiment is constructed with plural layers mainly made of organic compounds. The functional layer 17 can be formed by a well-known material, such as a low-molecular dye material and a conjugated high-molecular material, which is used in a general organic EL device. Alternatively, the functional layer 17 may have a stacked multi-layer structure including plural layers such as a hole-injection layer, a hole-transport layer, the organic light emitting layer, an electron-transport layer, and an electron-injection layer.

At this point, functional layer 17 includes a PN junction, and has rectifying action. That is, in the functional layer 17, the current is passed from the anode only to the cathode, but the current is not passed from the cathode to the anode. In the first embodiment, the current is passed from the first electrode layer 16 that is of the anode toward the second electrode layer 18 that is of the cathode in the organic light emitting layer.

There is no particular limitation to a material for the second electrode layer 18, and for example, metals such as silver (Ag) and aluminum (Al) can be cited as the material for the second electrode layer 18. The second electrode layer 18 of the first embodiment is made of Al.

The organic-EL-module feeding structure 100 to which the plurality of organic EL modules 1 are connected will be described below. In the first embodiment, as illustrated in FIG. 3, the case that the four organic EL modules 1*a* to 1*d* are connected to the organic-EL-module feeding structure 100 via the connecting members 12 will be described.

As illustrated in FIGS. 3 and 4, in the organic-EL-module feeding structure 100 of the first embodiment, the organic EL modules 1 (1*c*, 1*a*, and 1*d*) are laid so as to be adjacent to the organic EL module 1 (1*b*) directly connected to the external power supply in a row direction 1 (a direction orthogonal to a column direction w) and the column direction w.

When attention is paid to the connector units 10*a* and 10*c* provided in parallel in the row direction 1 of the organic EL module 1*b*, the connector unit 10*a* of the organic EL module 1*b* is electrically connected to the external power supply as illustrated in FIG. 3.

The connector unit 10*c* of the organic EL module 1*b* is electrically connected to the connector unit 10*a* of the organic EL module 1*d* that is adjacent to the organic EL module 1*b* in the row direction 1 via the connecting member 12.

The connecting member 12 is a connection cable having conductivity. As illustrated in FIG. 4, the connecting member 12 can electrically connect the connecting terminals 20*a* and 20*b* to each other, and electrically connect the connecting terminals 21*a* and 21*b* to each other. That is, the connecting member 12 is connected to the connector unit 10 of the connection-target organic EL module 1, which allows the connector units 10 and 10 of the connection-target organic EL module 1 to be electrically connected to each other.

Specifically, as illustrated in FIG. 4, the feeding terminals 7 and 8 of the connector unit 10*a* of the organic EL module 1*b* are connected to power-supply terminals 22 and 23 of the external power supply.

The feeding terminals 7 and 8 of the connector unit 10*c* of the organic EL module 1*b* are connected to connecting terminals 20*a* and 21*a* on one side of the connecting member 12. The feeding terminals 7 and 8 of the connector unit 10*a* of the organic EL module 1*d* are connected to connecting terminals 20*b* and 21*b* on the other side of the connecting member 12.

On the other hand, when attention is paid to the connector units 10*d* and 10*b* provided in parallel in the column direction w of the organic EL module 1*b* in FIG. 3, the connector unit 10*d* of the organic EL module 1*b* is electrically connected to the connector unit 10*b* of the organic EL module 1*a* that is adjacent to the organic EL module 1*b* in the column direction w via the connecting member 12. Similarly the connector unit 10*b* of the organic EL module 1*b* is electrically connected to the connector unit 10*d* of the organic EL module 1*c* that is adjacent to the organic EL module 1*b* in the column direction w via the connecting member 12.

More particularly, as illustrated in FIG. 4, the feeding terminals 7 and 8 of the connector unit 10*b* of the organic EL module 1*b* are connected to the connecting terminals 20*a* and 21*a* on one side of the connecting member 12. The feeding terminals 7 and 8 of the connector unit 10*d* of the organic EL module 1*c* are connected to the connecting terminals 20*b* and 21*b* on the other side of the connecting member 12. Similarly, the feeding terminals 7 and 8 of the connector unit 10*d* of the organic EL module 1*b* are connected to the connecting terminals 20*a* and 21*a* on one side of the connecting member 12. The feeding terminals 7 and 8 of the connector unit 10*b* of the organic EL module 1*a* are connected to the connecting terminals 20*b* and 21*b* on the other side of the connecting member 12.

A current flow in the organic-EL-module feeding structure 100 of the first embodiment will be described below.

As to the organic-EL-module feeding structure 100, in one organic EL module 1*b*, the current supplied from the external power supply is split into four conductive pathways passing through each of the organic EL device 3*b* and the connector units 10*b*, 10*c*, and 10*d*. The currents split into the conductive pathways by the conductive pathways pass through the organic EL devices 3*a* to 3*d* provided in the organic EL module 1*a* to 1*d*, respectively, via the connecting member 12.

Figure 5:
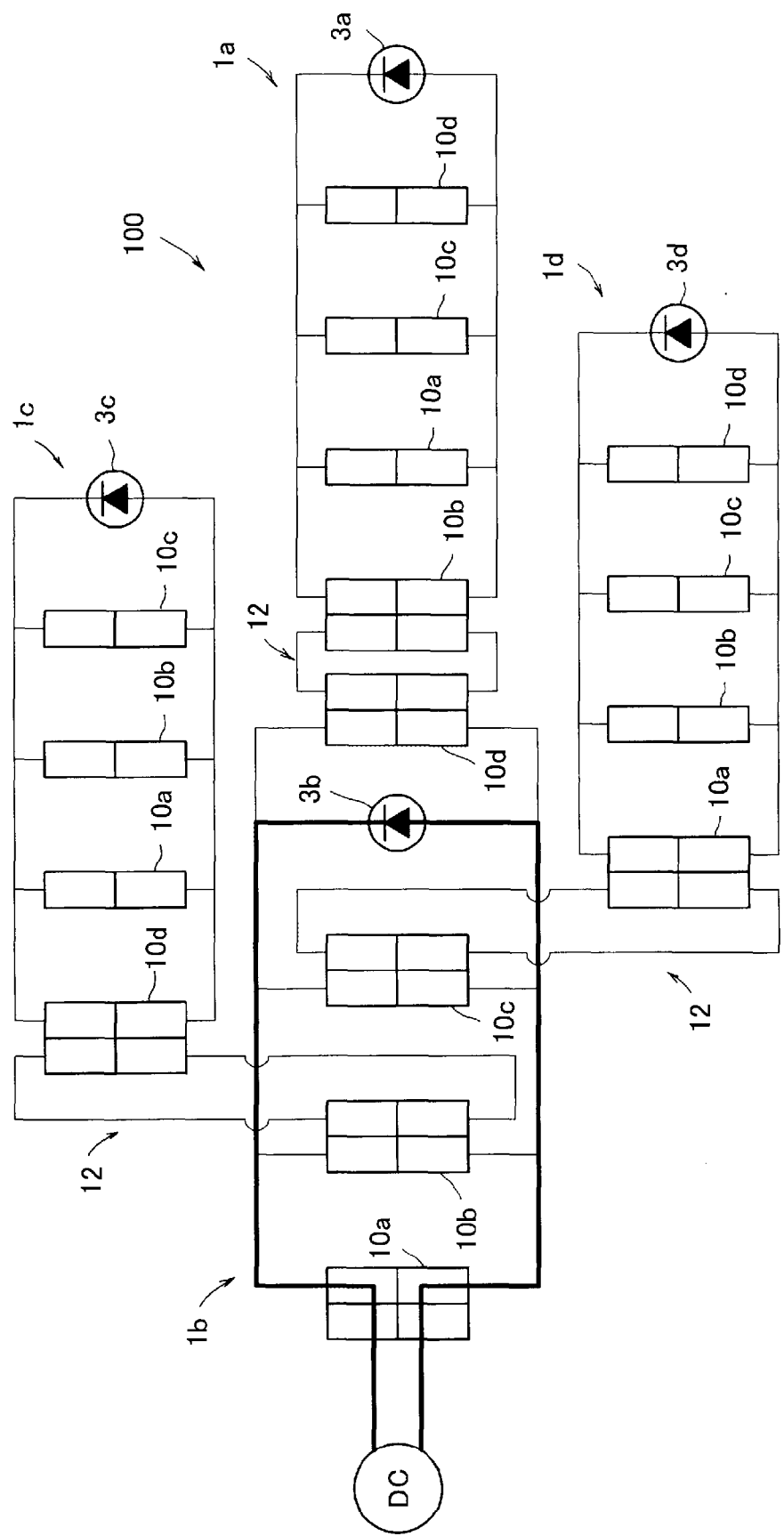
FIG. 5 is an explanatory view illustrating a current flow in the electric circuit diagram of the organic-EL-module feeding structure in FIG. 4, and expressing a current conducting pathway by a bold line.

Specifically, as illustrated in FIG. 5, in a first conductive pathway (self conductive pathway), the current supplied from the external power supply into the organic EL module 1b via the connector unit 10a is partially carried to the organic EL device 3b in the organic EL module 1b, and returned to the external power supply via the connector unit 10a.

At this point, in the organic-EL-module feeding structure 100, the power is fed from the external power supply to the organic EL device 3b in the organic EL module 1b, whereby the functional layer 17 in the organic EL device 3b emits the light. That is, the organic EL module 1b serves as the lighting device.

Figure 6:
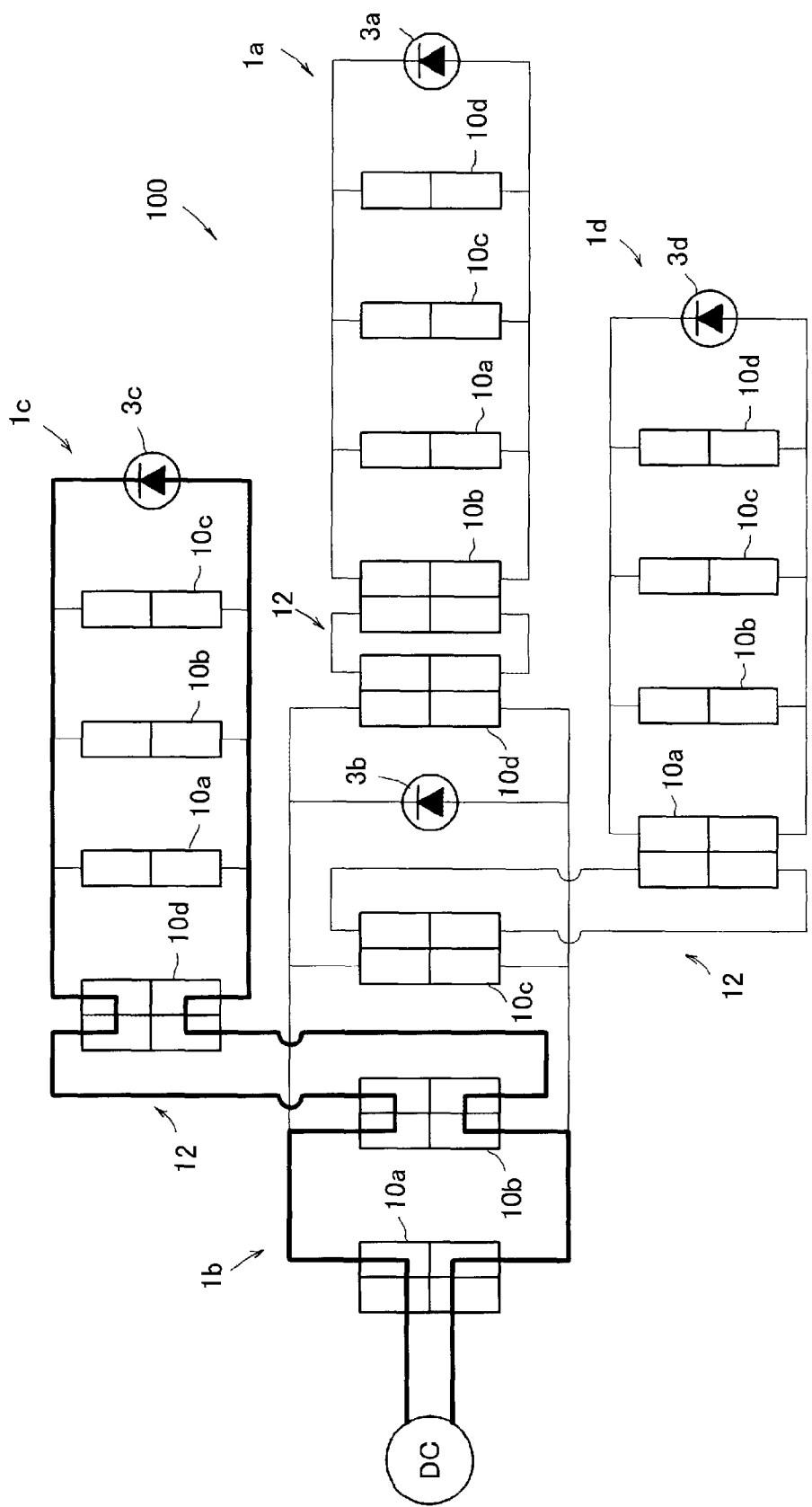
FIG. 6 is an explanatory view illustrating the current flow in the electric circuit diagram of the organic-EL-module feeding structure in FIG. 4, and expressing the current conducting pathway by the bold line.

As illustrated in FIG. 6, in a second conductive pathway (split flow pathway), the current supplied from the external power supply into the organic EL module 1b via the connector unit 10a is carried from the connector unit 10b of the organic EL module 1b to the connector unit 10d of the organic EL module 1c via the connecting member 12. The current carried to the connector unit 10d is carried to the organic EL device 3c, and carried from the organic EL device 3c to the connector unit 10d. The current carried to the connector unit 10d is carried to the connector unit 10b of the organic EL module 1b from the connector unit 10d of the organic EL device 1c via the connecting member 12. The current carried to the connector unit 10b is carried into the organic EL module 1b, and returned from the connector unit 10a to the external power supply.

At this point, a closed circuit passing through the external power supply, the connecting member 12, and the organic EL device 3c having a load of the functional layer 17 is formed in the organic-EL-module feeding structure 100, and the power is fed from the external power supply to the organic EL device 3c in the organic EL module 1c, whereby the functional layer 17 in the organic EL device 3c emits the light. That is, the organic EL module 1c serves as the lighting device.

Figure 7:
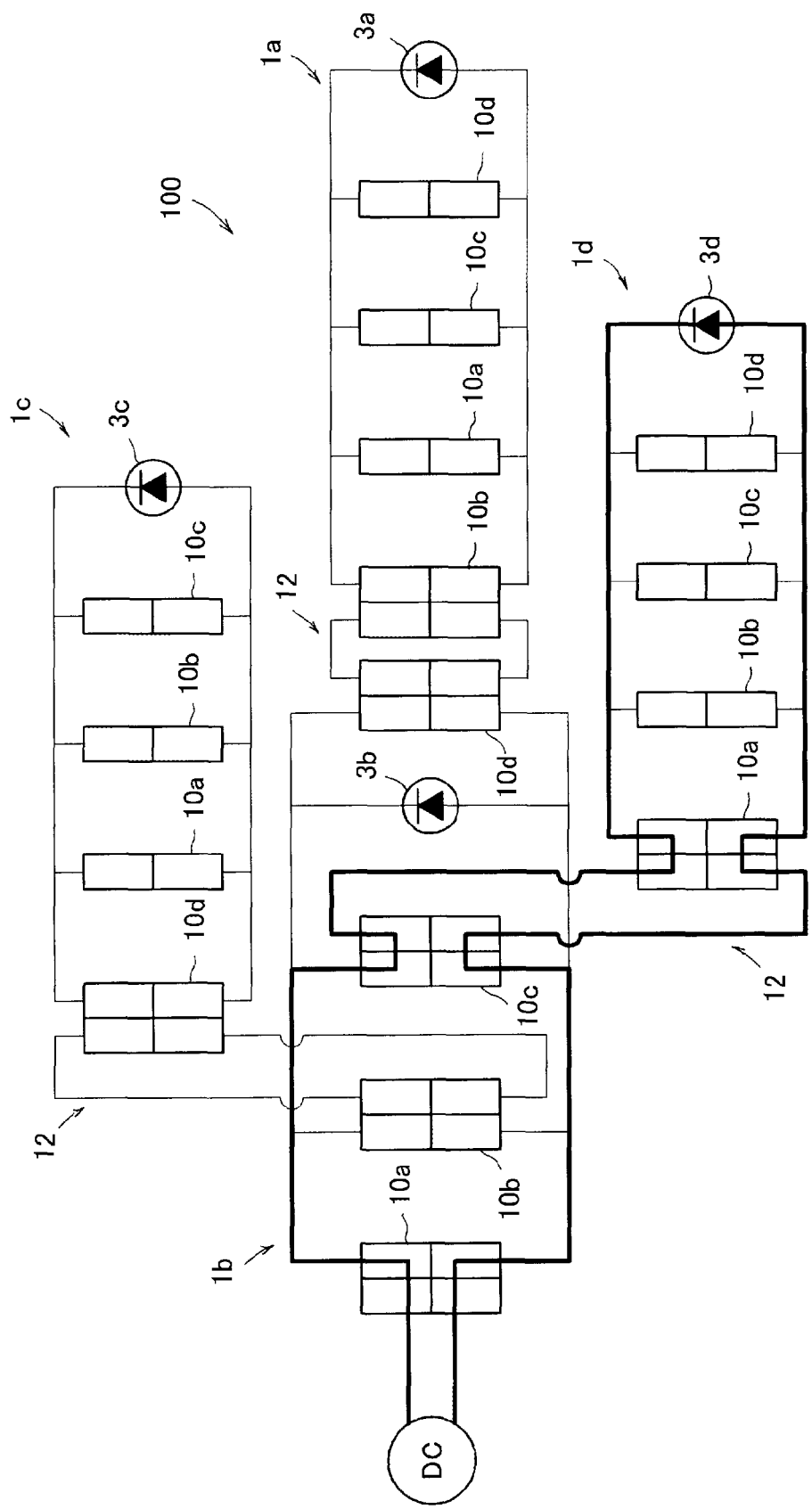
FIG. 7 is an explanatory view illustrating the current flow in the electric circuit diagram of the organic-EL-module feeding structure in FIG. 4, and expressing the current conducting pathway by the bold line.

As illustrated in FIG. 7, in a third conductive pathway (split flow pathway), the current supplied from the external power supply into the organic EL module 1b via the connector unit 10a is carried from the connector unit 10c of the organic EL module 1b to the connector unit 10a of the organic EL module 1d via the connecting member 12. The current carried to the connector unit 10a is carried to the organic EL device 3d in the organic EL module 1d, and carried from the organic EL device 3d to the connector unit 10a. The current carried to the connector unit 10a is carried from the connector unit 10a of the organic EL module 1d to the connector unit 10c of the organic EL module 1b via the connecting member 12. The current carried to the connector unit 10c is carried into the organic EL module 1b, and returned from the connector unit 10a to the external power supply.

At this point, the closed circuit passing through the external power supply, the connecting member 12, and the organic EL device 3d having the load of the functional layer 17 is formed in the organic-EL-module feeding structure 100, and the power is fed to the organic EL device 3d in the organic EL module 1d, whereby the functional layer 17 in the organic EL device 3d emits the light. That is, the organic EL module 1d serves as the lighting device.

Figure 8:
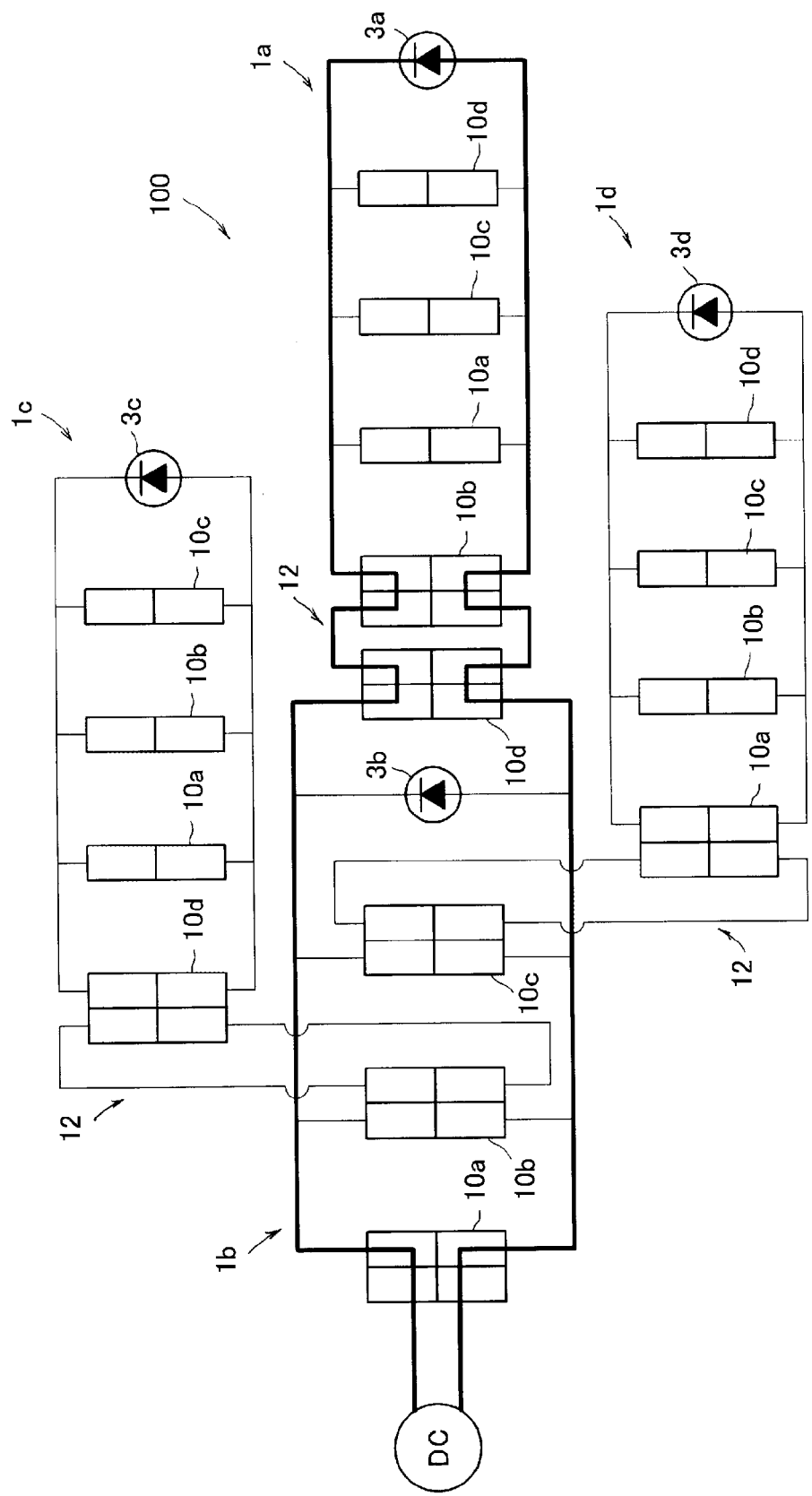
FIG. 8 is an explanatory view illustrating the current flow in the electric circuit diagram of the organic-EL-module feeding structure in FIG. 4, and expressing the current conducting pathway by the bold line.

As illustrated in FIG. 8, in a fourth conductive pathway (split flow pathway), the current supplied from the external power supply into the organic EL module 1b via the connector unit 10a is carried from the connector unit 10d of the organic EL module 1b to the connector unit 10b of the organic EL module 1a via the connecting member 12. The current carried to the connector unit 10b is carried to the organic EL device 3a in the organic EL module 1a, and carried from the organic EL device 3a to the connector unit 10b. The current carried to the connector unit 10b is carried from the connector unit 10b of the organic EL module 1a to the connector unit 10d of the organic EL module 1b via the connecting member 12. The current carried to the connector unit 10d is carried into the organic EL module 1b, and returned from the connector unit 10a to the external power supply.

At this point, the closed circuit passing through the external power supply, the connecting member 12, and the organic EL device 3a having the load of the functional layer 17 is formed in the organic-EL-module feeding structure 100, and the power is fed from the external power supply to the organic EL device 3a in the organic EL module 1a, whereby the functional layer 17 in the organic EL device 3a emits the light. That is, the organic EL module 1a serves as the lighting device.

As described above, the current supplied from the external power supply is split into the plurality of conductive pathways, and the power is fed to the organic EL devices 3a to 3d in the organic EL modules 1a to 1d. That is, in the organic-EL-module feeding structure 100, the current can be passed from one external power supply to the plurality of organic EL modules 1a to 1d, and the light emitting surface 53 (see FIG. 14) of each of the organic EL modules 1a to 1d can emit the light.

As described above, in the organic EL module 1, the connector units 10a to 10d are electrically connected in parallel to one another, and electrically connected in parallel to the organic EL devices 3a to 3d.

In the connector units 10a to 10d of the organic EL module 1, even if the external power supply is connected to the unused connector unit 10, namely, the connecting terminals 20 and 21 (20a and 21a or 20b and 21b) of the connecting member 12 or any connector unit 10 to which the power-supply terminals 22 and 23 of the external power supply is not connected, a voltage can be applied between the first electrode layer 16 and the second electrode layer 18 in the organic EL device 3 of the connected organic EL module 1.

Therefore, even if the organic EL modules 1 are densely laid without gaps, the connector units 10a to 10d to which the external power supply is connected can be selected, and the external power supply can easily be connected to any of the desired connector units 10a to 10d. That is, a layout is easy to change.

In the organic-EL-module feeding structure 100 of the first embodiment, because the organic EL module 1 serves as part of a feeding wiring, it is not necessary to change a length of the connecting member 12 according to an installation environment. Therefore, the connecting member 12 is easily standardized, and versatility is enhanced.

In the case where the organic EL module 1 is newly added by a layout change and the like, the feeding terminals 7 and 8 of the connector unit 10 of the added organic EL module 1 and the feeding terminals 7 and 8 of the connector unit 10 (unused connector unit) that is not connected in the connector unit 10a to 10d of the existing organic EL modules 1 are connected to each other by the connecting member 12. Therefore, the power can be fed to the added organic EL module 1 via the existing organic EL module 1, and the new organic EL module 1 is easy to add.

An organic-EL-module feeding structure 200 according to a second embodiment will be described below. The component similar to that of the first embodiment is designated by the identical symbol, and the description is neglected.

The organic-EL-module feeding structure 200 of the second embodiment differs from the organic-EL-module feeding structure 100 of the first embodiment in the number of connected organic EL modules 1.

Figure 9:
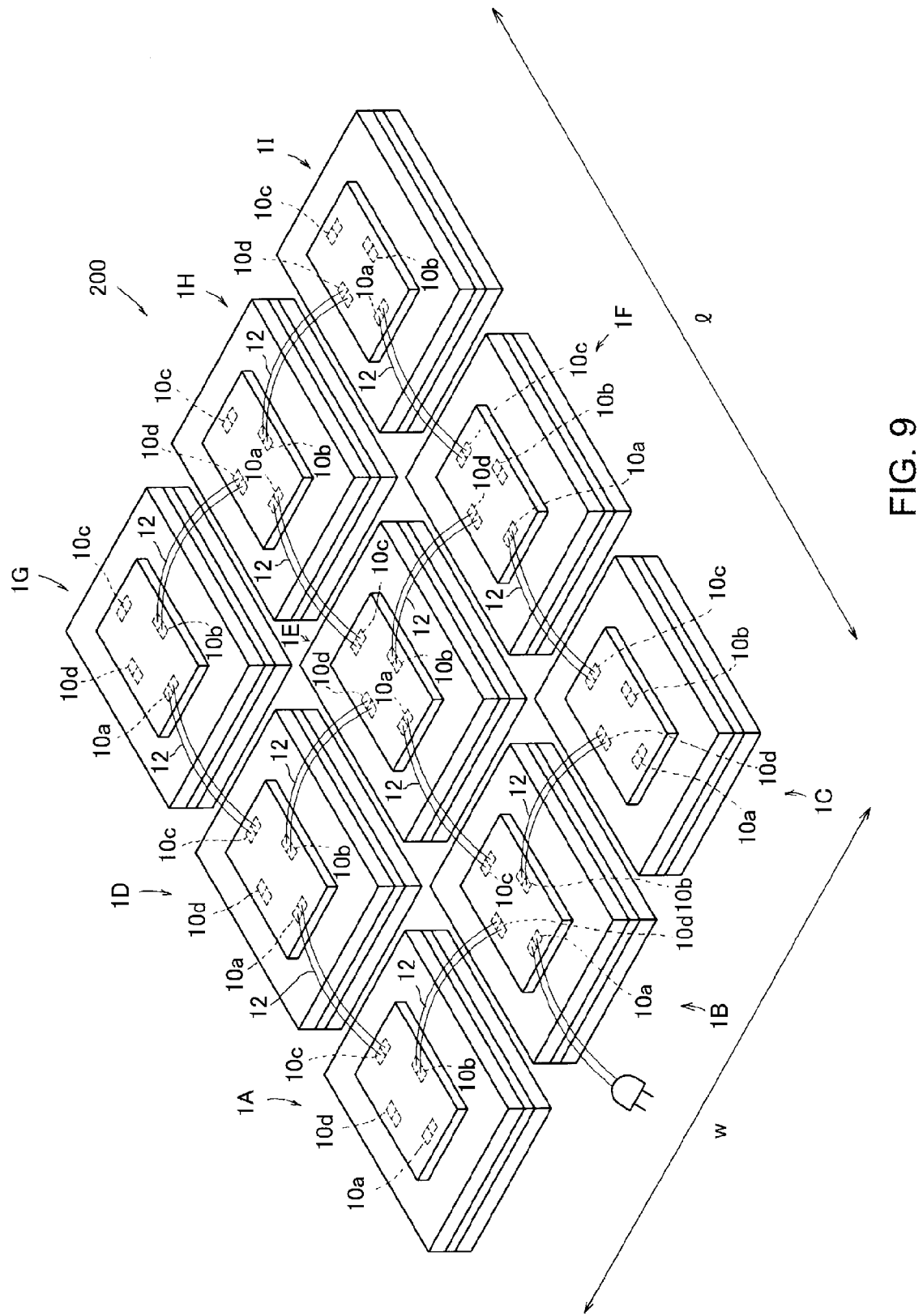
FIG. 9 is a perspective view conceptually illustrating an organic-EL-module feeding structure according to a second embodiment of the present invention.

As illustrated in FIG. 9, in the organic-EL-module feeding structure 200 of the second embodiment, nine organic EL modules 1 (1A to 1I) are connected to one another by the connecting members 12. As illustrated in FIG. 9, in the organic-EL-module feeding structure 200, the organic EL modules 1 are provided in a grid pattern.

Specifically, as illustrated in FIG. 9, in the organic-EL-module feeding structure 200, a total of nine organic EL modules are laid, namely, three organic EL modules are laid in a vertical direction (row direction 1) while three organic EL modules are laid in a horizontal direction (column direction w). In the organic-EL-module feeding structure 200, the organic EL modules 1 adjacent to each other are electrically connected to each other by the connecting member 12. That is, a plurality of closed circuits that do not pass through the external power supply are formed between the pathway and the organic EL module 1 (1A to 1I).

Figure 10:
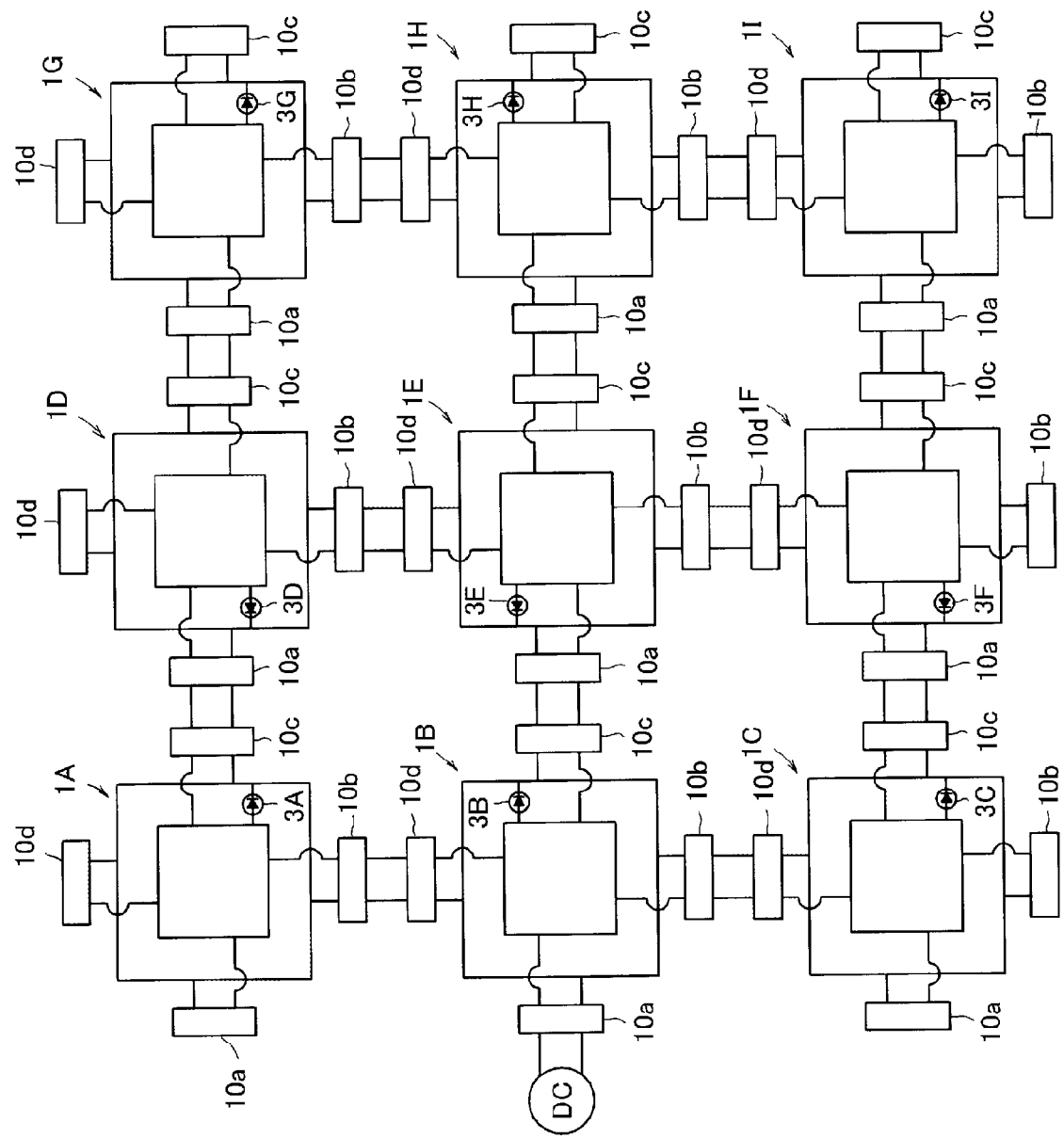
FIG. 10 is an electric circuit diagram illustrating the organic-EL-module feeding structure in FIG. 9.

As illustrated in FIG. 10, because the organic EL modules 1 (1A to 1I) are electrically connected in parallel to one another, the connector units 10a to 10d of any one of the organic EL modules 1 (1A to 1I) are electrically connected in parallel to the organic EL devices 3A to 3I.

As illustrated in FIG. 9, in the organic-EL-module feeding structure 200, the plurality of connecting members 12 are connected to each of the organic EL module 1A to 1I to form the plurality of feeding pathways to the organic EL device 3A to 3I.

Attention is paid to the organic EL module 1E located in the center in the row direction 1 and the column direction w as a typical example, and the feeding pathway from the external power supply to the organic EL module 1E is described, and the description of other organic EL modules 1 is neglected.

As illustrated in FIG. 9, the connector unit 10a of the organic EL module 1E is electrically connected to the connector unit 10c of the adjacent organic EL module 1B via the connecting member 12. The connector unit 10b of the organic EL module 1E is electrically connected to the connector unit 10d of the adjacent organic EL module 1F via the connecting member 12. The connector unit 10c of the organic EL module 1E is electrically connected to the connector unit 10a of the adjacent organic EL module 1H via the connecting member 12. The connector unit 10d of the organic EL module 1E is electrically connected to the connector unit 10b of the adjacent organic EL module 1D via the connecting member 12.

As illustrated in FIGS. 11A to 11D, the organic-EL-module feeding structure 200 includes four feeding pathways as the feeding pathway to the organic EL module 1E.

Specifically, as illustrated in FIG. 11A, a first feeding pathway directly reaches the organic EL module 1E from the external power supply via the organic EL module 1B.
As illustrated in FIG. 11B, a second feeding pathway reaches the organic EL module 1E from the external power supply via the organic EL module 1B, the organic EL module 1A, and the organic EL module 1D.
As illustrated in FIG. 11C, a third feeding pathway reaches the organic EL module 1E from the external power supply via the organic EL module 1B, the organic EL module 1C, and the organic EL module 1F.
As illustrated in FIG. 11D, a fourth feeding pathway reaches the organic EL module 1H from the external power supply via the organic EL module 1B, the organic EL module 1A, the organic EL module 1D, and the organic EL module 1G. The fourth feeding pathway also reaches the organic EL module 1H from the external power supply via the organic EL module 1B, the organic EL module 1C, the organic EL module 1F, and the organic EL module 1I. Then the fourth feeding pathway reaches the organic EL module 1E from the organic EL module 1H.

Because the organic-EL-module feeding structure 200 has the plurality of feeding pathways to the organic EL module 1 of the feeding target, the power can be fed to the organic EL module 1 of the feeding target while a load on the connecting member 12 to which each organic EL module 1 is connected is dispersed. That is, in the organic-EL-module feeding structure 200, the connecting member 12 is hardly disconnected when the power is fed. The load on the connecting member 12 is decreased, so that a diameter of a cable of the connecting member 12 can be decreased. That is, the cost can be reduced in the organic-EL-module feeding structure 200.

From a different viewpoint, when one feeding pathway is secured in the feeding pathways to the organic EL module 1E, because the power can be fed to the organic EL device 3 of the organic EL module 1E, a connection relationship among the organic EL modules 1 can easily be changed during the layout change.

Figure 12:
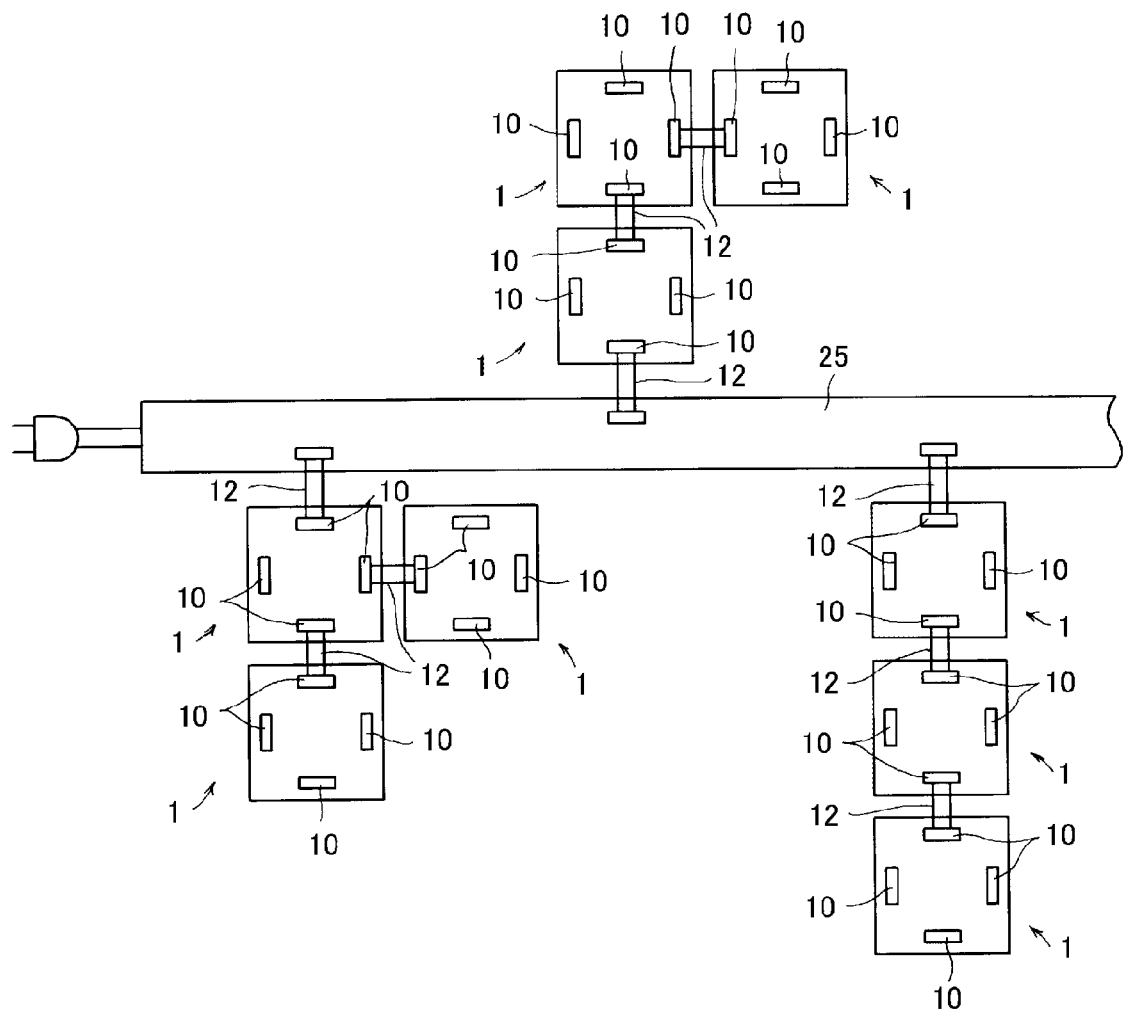
FIG. 12 is a schematic view illustrating an organic-EL-module feeding structure according to another embodiment of the present invention.

In the above embodiments, although the external power supply is directly connected to the connector unit 10, the present invention is not limited to this. Alternatively, the external power supply may be directly connected to the connector unit 10 via a feeding member 25 provided in a wiring duct rail, or the like. At this point, preferably the external power supply is connected to the connector unit 10 while the feeding member 25 is branched as illustrated in FIG. 12.

Figure 13A:
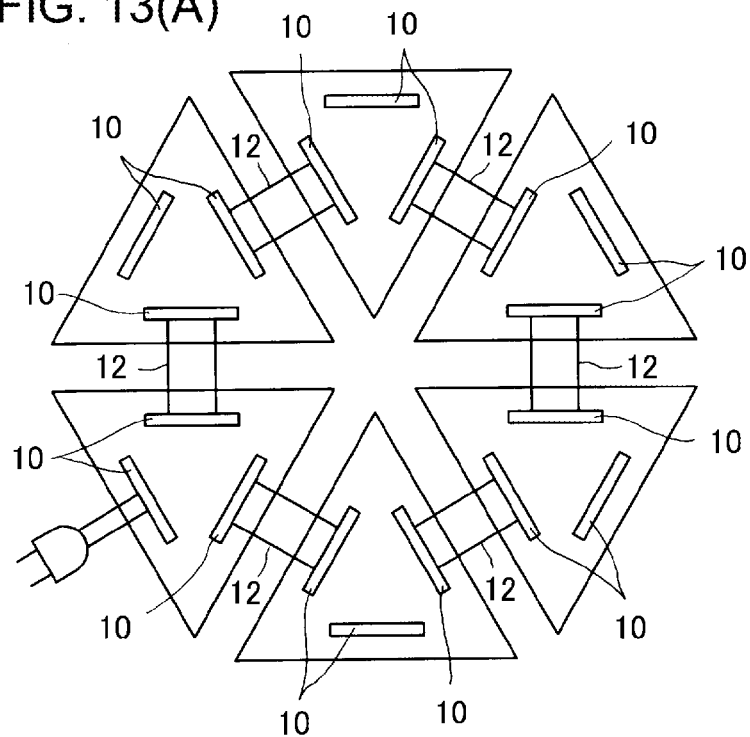
FIGS. 13A and 13B are schematic views illustrating organic-EL-module feeding structures according to still other embodiments of the present invention.
Figure 13B:
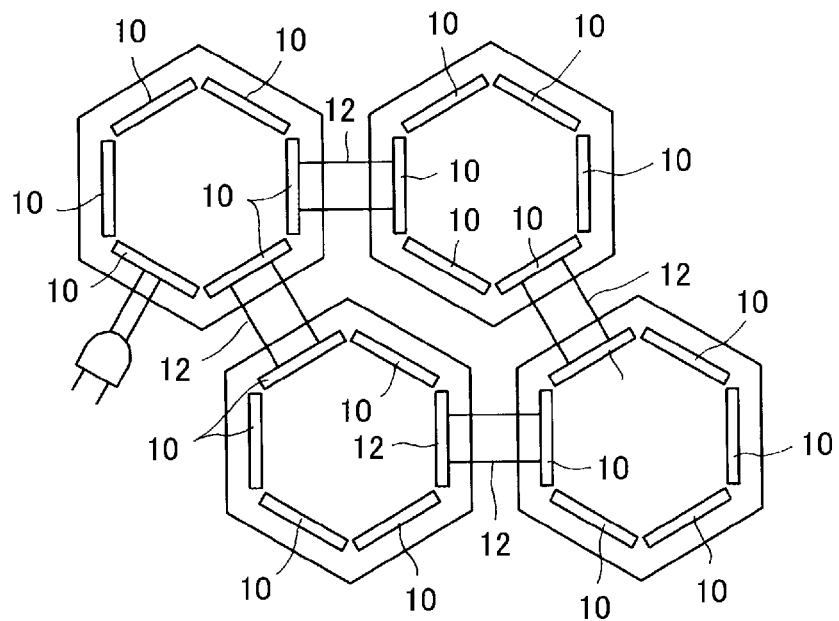

In the above embodiments, the square connecting plate 2 is used. However, in the present invention, there is no limitation to the shape of the connecting plate 2 as long as the connecting plate 2 includes at least the three sides different from one another. For example, the connecting plate 2 may have a triangular shape in FIG. 13A or a hexagonal shape in FIG. 13B. At this point, preferably the connector unit 10 is arranged at the position corresponding to the side near another connecting plate 2 when another connecting plate 2 is laid. The connecting plate 2 may includes not only the linear side but also a curved side.

From the viewpoint of laying the organic EL modules 1 in the whole surface without gaps, preferably the connecting plate 2 has the shape in which the organic EL modules are arranged so as to be densely laid with a planar expanse.

In the above embodiments, by way of example, the DC power supply is used as the external power supply. However, in the present invention, there is no limitation to the kind of the power supply. An AC power supply may be used as the external power supply. In this case, preferably the mounting unit 5 of each organic EL module 1 includes a rectifier circuit.

At this point, in the organic EL module 1 of the above embodiments, the mounting unit 5 is provided in the center of the fixed unit 6. In other words, the mounting unit 5 is located above the light emitting surface 53 of the organic EL device 3.

Therefore, the feeding structure of the organic EL device 3 is required in order to carry the current from the mounting unit 5 to the feeding unit 55. The feeding structure used in the following examples of the present invention will be described below.

Although the present invention is more specifically described with the organic EL module 1 as a first example, the present invention is not limited to the first example.

Figure 14:
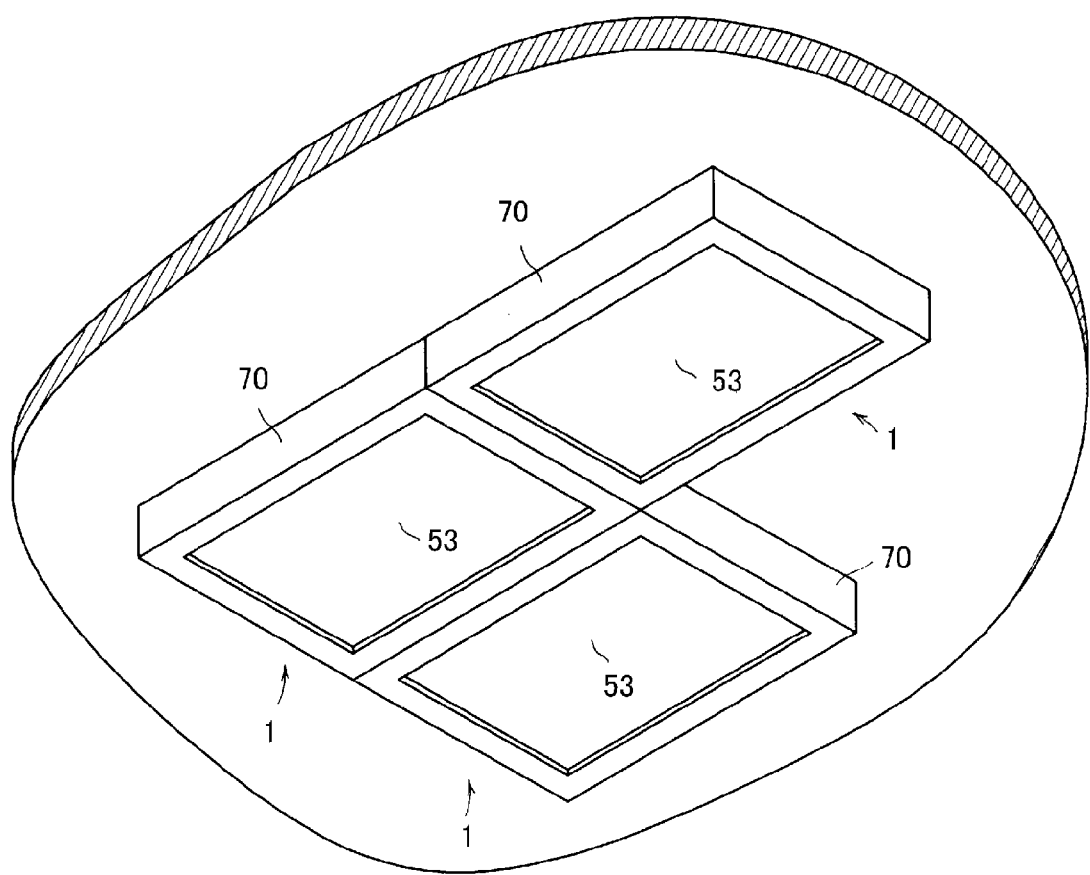
FIG. 14 is a perspective view of an organic EL module according to a first example of the present invention when the organic EL module is viewed from a bottom surface side.

As illustrated in FIG. 14, the organic EL module 1 of the first example can be laid without gaps with a planar expanse together with the plurality of organic EL modules 1.

Figure 15:
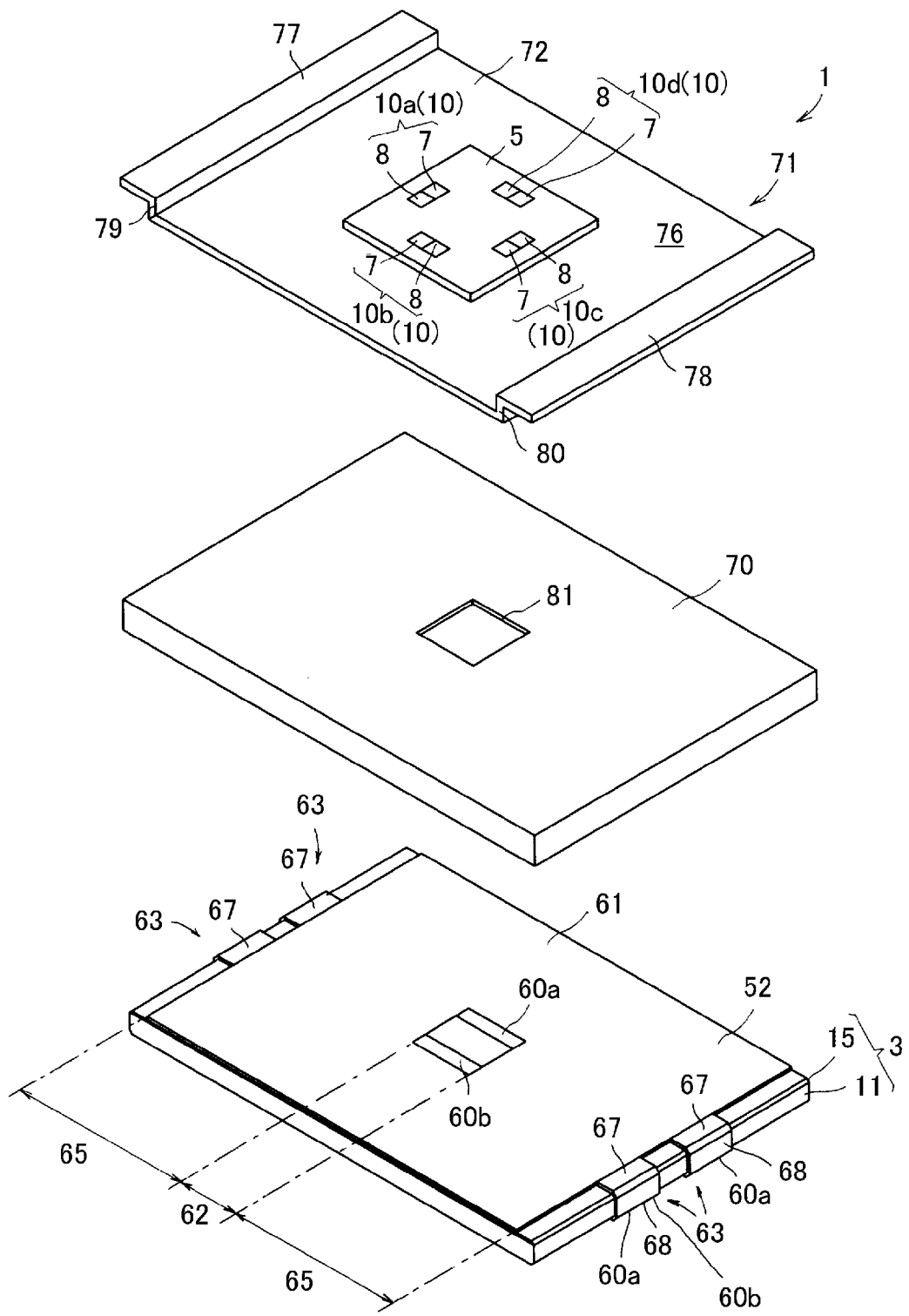
FIG. 15 is an exploded perspective view of the organic EL module in FIG. 14.
Figure 16:
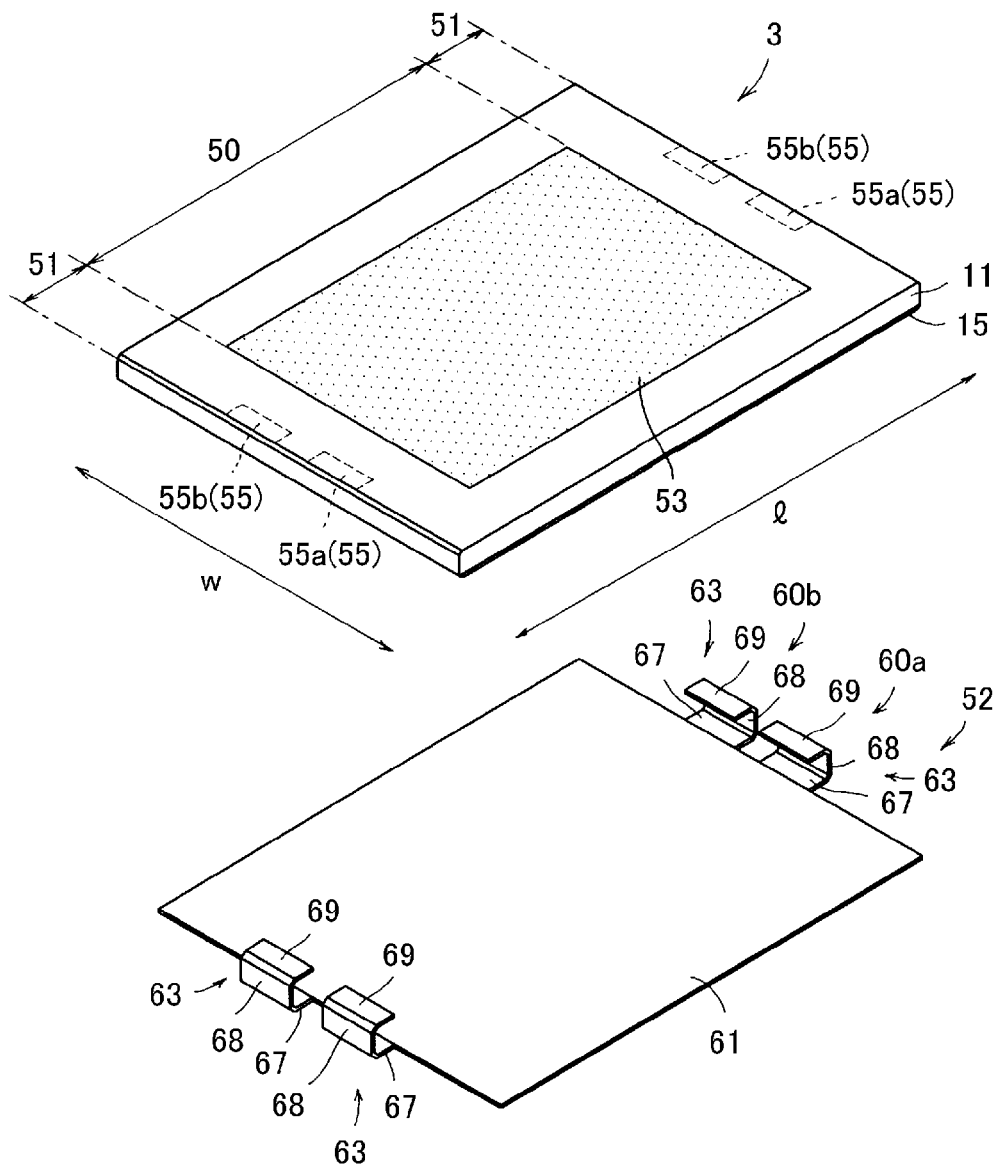
FIG. 16 is a perspective view of an organic EL device and a conductive member in FIG. 15 when the organic EL device and the conductive member are viewed from another direction (organic EL device side).

As illustrated in FIGS. 15 and 16, the organic EL module 1 includes the organic EL device 3, a conductive member 52, a frame body 70, and a base member 71 (corresponding to the fixed unit 6).

A configuration of each member will be described below. As described above, in the organic EL device 3, the organic EL element 15 is stacked on the substrate 11 having the translucency. As illustrated in FIG. 16, in the plane of the organic EL device 3, the organic EL device 3 is divided into a light emitting region 50 where the light emitting surface 53 emitting actually the light during the operation is located and a plurality of feeding regions 51 to which the power is fed during the operation. Specifically, the light emitting region 50 is located in the center of the longitudinal direction 1 (the direction orthogonal to the width direction w) of the organic EL device 3. The feeding regions 51 are provided around the light emitting region 50, and arranged on the two sides between which the light emitting region 50 is sandwiched. The organic EL device 3 of the first example is what is called a "bottom emission" type organic EL device in which the light is taken out from at least the side of the substrate 11.

In the organic EL device 3, one or a plurality of organic EL elements 15 are incorporated in the light emitting region 50. A structure in which the plurality of organic EL elements 15 are incorporated in the light emitting region 50 is used in the organic EL device 3 of the first example. In the first example, many organic EL elements 15 are distributed on one surface of the substrate 11 with a planar expanse, and the organic EL elements 15 are electrically connected in series on the substrate 11. That is, the organic EL device 3 of the first example is what is called an integrated type organic EL device. For this reason, a power loss caused by a voltage drop between the electrode layers of the organic EL element 15 can be reduced. The organic EL elements 15 distributed on one surface of the substrate 11 with the planar expanse emit the light, so that evenness of the emission can be enhanced in the light emitting surface 53.

As illustrated in FIG. 16, in the feeding region 51, a plurality of feeding units 55 are exposed on the side (the side of the conductive member 52) opposite to the substrate 11. More specifically, in the feeding region 51, the four feeding units 55 are formed on the back side (the side opposite to the light emitting surface 53, the lower side in FIG. 16) of the substrate 11 as illustrated in FIG. 16. That is, the two feeding units 55a and 55b are provided in one side. The two feeding units 55a and 55b are also provided in the opposed side.

The feeding unit 55 is a portion in which conductive films 56a and 56b (to be described) are exposed, and the feeding unit 55 has areas of several square millimeters to several centimeters.

Figure 17:
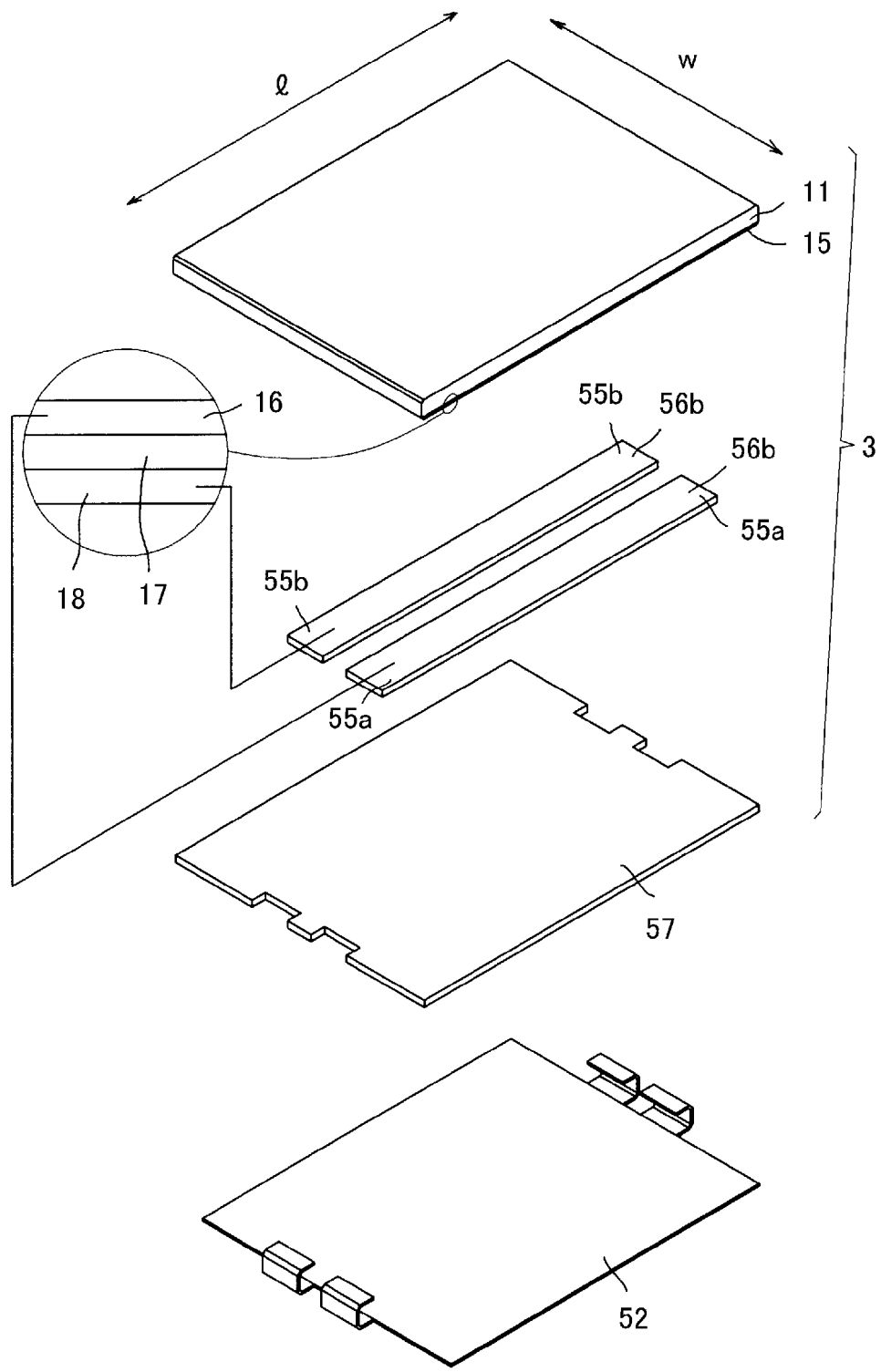
FIG. 17 is an exploded perspective view of the further-exploded organic EL device in FIG. 16.

The feeding unit 55 is electrically connected to the first electrode layer 16 or second electrode layer 18 in the organic EL element 15. In FIG. 17, a circular enlarged view schematically illustrates a state in which the feeding unit 55a is electrically connected to the first electrode layer 16 while the feeding unit 55b is electrically connected to the second electrode layer 18.

In the lengthwise direction 1 of the substrate 11, the feeding units 55a and 55a located at the positions opposed to each other are connected to the first electrode layer 16 and second electrode layer 18 in the organic EL element 15, respectively. The feeding units 55b and 55b located at the positions opposed to each other are connected to the first electrode layer 16 and second electrode layer 18 in the organic EL element 15, respectively.

Specifically, as illustrated in FIG. 17, the feeding units 55a and 55a are electrically connected to the first electrode layer 16 in the organic EL element 15. On the other hand, feeding units 55b and 55b are electrically connected to the second electrode layer 18 in the organic EL element 15.

On the other hand, the feeding unit 55a electrically connected to the first electrode layer 16 in the organic EL element 15 and the feeding unit 55b electrically connected to the second electrode layer 18 are provided in the width direction w of the substrate 11.

As described above, the organic EL element 15 includes the functional layer 17 between the first electrode layer 16 and the second electrode layer 18. In the organic EL element 15, as illustrated in FIG. 17, the conductive films 56a and 56b electrically connected to the first electrode layer 16 and second electrode layer 18 are stacked in the organic EL element 15.

FIG. 17 is an exploded perspective view illustrating part of the organic EL element 15 of the organic EL device 3 in FIG. 16. The conductive films 56a and 56b are thin films constituting the feeding units 55a and 55b and having electric conductivity. The conductive films 56a and 56b extend in longitudinal direction 1 of the organic EL device 3. In a region except the feeding units 55a and 55b, an insulating film 57 is stacked across the two conductive films 56a and 56b. In other words, the feeding unit 55 is a portion in which the conductive films 56a and 56b that are of the conductor are exposed.

That is, in the organic EL device 3, the feeding units 55a and 55a are electrically connected to the feeding units 55b and 55b by the conductive film 56a and 56b.

Figure 18:
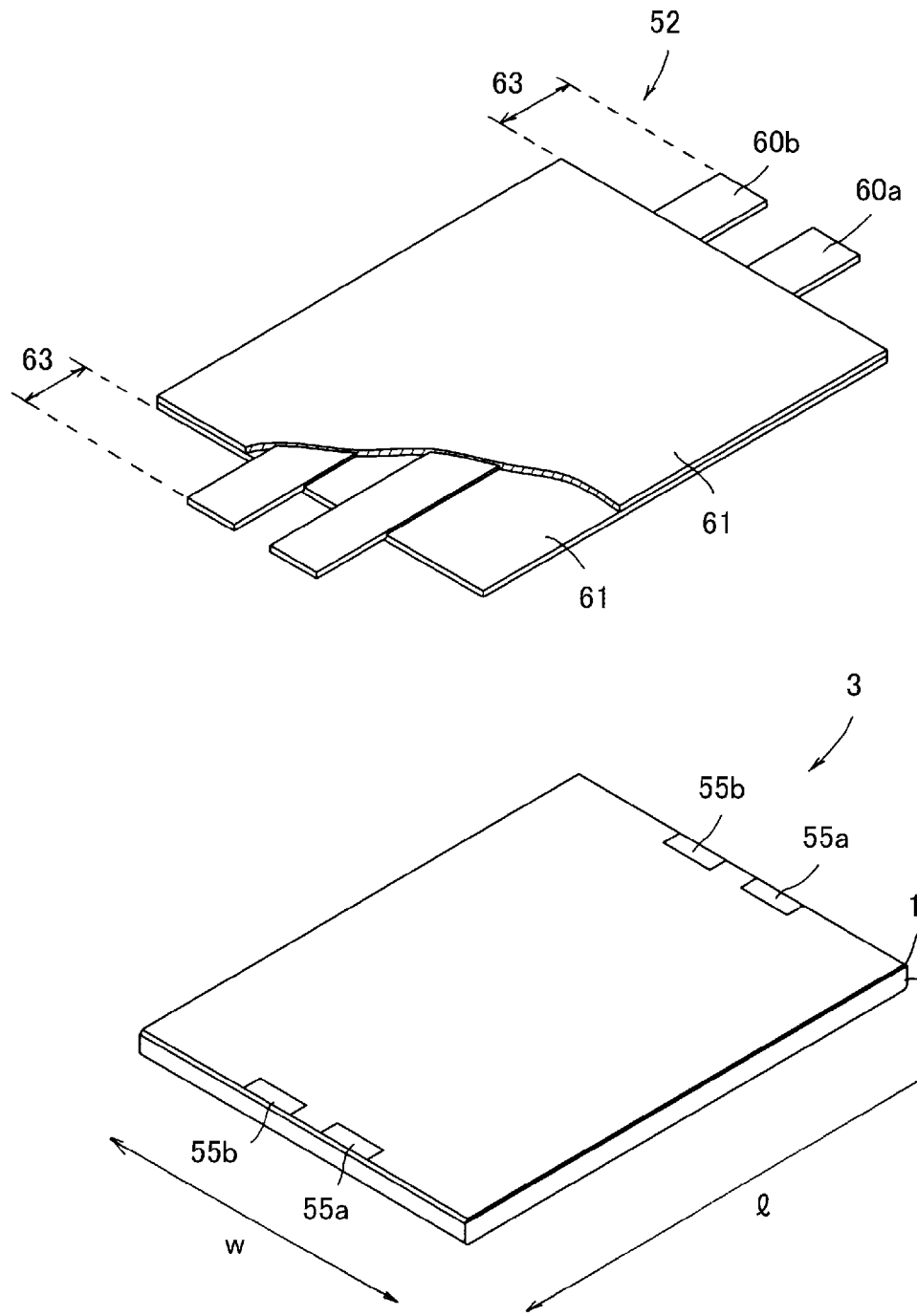
FIG. 18 is an exploded perspective view of the organic EL device and conductive member in FIG. 15 while conductive foils are extended into a planar shape.

The conductive member 52 will be described below.
As illustrated in FIG. 18, the conductive member 52 covers a part or whole on the side opposite to the substrate 11 of the organic EL device 3. FIG. 18 is an explanatory view in which conductive foils 60a and 60b of the conductive member 52 are planarly elongated.

As illustrated in FIG. 18, the conductive member 52 is constructed with the plurality of conductive foils 60a and 60b and insulating resin films 61 that cover both surfaces of the conductive foils 60a and 60b. In the first example, the two conductive foils 60a and 60b and a middle portion of each of the conductive foils 60a and 60b are covered with the two resin films 61 and 61. As illustrated in FIG. 15, on one of the surfaces (top surface), a central region of the resin film 61 is partially peeled off to form an opening, and the conductive foils 60a and 60b are exposed from the opening. That is, the current conduction can be established in the conductive member 52 via the region in which the conductive foils 60a and 60b are exposed from the opening.

The number of conductive foils 60 is decided depending on the number of feeding units 55a and 55b provided in the organic EL device 3. More specifically, the number of conductive foils 60 of the conductive member 52 is a half of the number of feeding units 55. An interval between the conductive foils 60 adjacent to each other is equal to a distance between the feeding units 55a and 55b in the width direction w.

As illustrated in FIG. 18, the conductive foils 60a and 60b are rectangular foils, a long side of each of the conductive foils 60a and 60b is arranged along the longitudinal direction 1 of the organic EL device 3. The conductive foils 60a and 60b are provided in parallel to each other in the width direction w with a predetermined gap, and unified by the resin films 61.

There is no particular limitation to the conductive foils 60a and 60b as long as the conductive foils 60a and 60b are foils having conductivity. For example, metallic conductive foils such as a copper foil, a silver foil, a gold foil, and a platinum foil can be used as the conductive foils 60a and 60b.

In the first example, a belt-shape copper foil is used as the conductive foils 60a and 60b.

As illustrated in FIG. 18, the resin film 61 spreads in the direction w in which the conductive foils 60a and 60b are provided in parallel (the direction orthogonal to the longitudinal direction 1 of the conductive foils 60a and 60b), and covers across the two conductive foils 60a and 60b. The resin films 61 and 61 covering the both surfaces of the conductive foils 60a and 60b are joined outside in the direction w in which the conductive foils 60a and 60b are provided in parallel. In other words, in the conductive member 52, the two resin films 61 are in close contact with each other, and the conductive foils 60a and 60b are inserted between the resin films 61.

There is no particular limitation to the resin film 61 as long as the resin film 61 is a resin thin film having the insulating property. For example, an insulating resin thin film made of polyethylene terephthalate (PET) or polyethylene (PE) can be used as the resin film 61. A sheet-like resin film 61 may be used.

The conductive member 52 is divided into insulating regions 65 in FIG. 15, conductive regions 63 in FIG. 18 located on both outsides in the longitudinal direction 1 of the insulating region 65, and a current carrying region 62 located in the center of the longitudinal direction 1 of the insulating region 65 in FIG. 15.

As illustrated in FIG. 15, in the insulating region 65, the both surfaces of the conductive foils 60a and 60b are covered with the resin films 61.

As illustrated in FIG. 18, in the conductive region 63, the conductive foils 60a and 60b are exposed from both the sides in the longitudinal direction 1 of the resin film 61.

As illustrated in FIG. 15, in the current carrying region 62, only one surface of each of the conductive foils 60a and 60b is exposed from the resin film 61. That is, the other surface of each of the conductive foils 60a and 60b is covered with the resin film 61 in the current carrying region 62.

As illustrated in FIG. 15, the conductive foils 60a and 60b in the conductive region 63 are folded back a plurality of times according to the side (long side) extending in the longitudinal direction of the organic EL device 3. Specifically, as illustrated in FIG. 15, the conductive foils 60a and 60b in the conductive region 63 are folded back twice so as to cover an end face of one side of the organic EL device 3. That is, as illustrated in FIG. 16, the conductive foils 60a and 60b in the conductive region 63 have U-shapes when viewed from the side.

More particularly, as illustrated in FIGS. 15 and 16, the conductive foils 60a and 60b in the conductive region 63 includes a top-surface protective unit 67, an end-face protective unit 68, and a bottom-surface protective unit 69.

As illustrated in FIG. 15, the top-surface protective unit 67 is substantially flush with the insulating region 65, and is provided on the top surface (the side opposed to the substrate 11 with the organic EL element 15 interposed therebetween) of the organic EL device 3.

As illustrated in FIG. 16, the end-face protective unit 68 protrudes downward (upward in FIG. 16) with respect to the top-surface protective unit 67, and protects the end face of the organic EL device 3.

As illustrated in FIG. 16, the bottom-surface protective unit 69 is folded back onto the side of the organic EL device 3 from an end portion in the protrusion direction of the end-face protective unit 68, and protects the bottom surface (the side of the substrate 11) of the organic EL device 3.

The frame body 70 will be described below.

The frame body 70 is a frame-shape member that covers an outer peripheral edge of the organic EL device 3. As illustrated in FIG. 19, the frame body 70 is a frame including an opening 82. That is, the frame body 70 covers the end faces of the four sides of the organic EL device 3, and is detachably attached along the edge of the organic EL device 3. The opening 82 has a rectangular shape in a planar view. When the frame body 70 is attached to the organic EL device 3, a part or whole of the light emitting surface 53 of the organic EL device 3 is exposed from the opening 82 of the frame body 70.

As illustrated in FIG. 19, the frame body 70 includes a light-emitting-surface-side covering unit 83, an organic-EL-element-side covering unit 85, and an end-face covering unit 86 that connects the light-emitting-surface-side covering unit 83 and the organic-EL-element-side covering unit 85. The frame body 70 also includes a fixed space 87 that is surrounded by the light-emitting-surface-side covering unit 83, the organic-EL-element-side covering unit 85, and the end-face covering unit 86. The fixed space 87 can accommodate the organic EL device 3 and the conductive member 52 therein.

There is no particular limitation to a material for the frame body 70 as long as the material has elasticity and flexibility. For example, an elastic silicone resin or an elastic rubber resin can be used as material for the frame body 70. Preferably the frame body 70 is formed by integral molding.

A size of the single frame body 70 is slightly smaller than a size of the frame body 70 attached to the organic EL module 1.

Specifically, the vertical, horizontal, or height size of the single frame body 70 is greater than or equal to 90% and less than 100% of the corresponding vertical, horizontal, or height size of the single frame body 70 attached to the organic EL module 1, preferably is greater than or equal to 95% and less than 99, and more preferably is greater than or equal to 96% and less than 98%.

As illustrated in FIG. 20, in the frame body 70, a through-hole 81 is made at the position that correspond to the current carrying region 62 (see FIG. 15) of the conductive member 52 when the frame body 70 is attached to the organic EL device 3.

Specifically, the through-hole 81 is provided in the center of the organic-EL-element-side covering unit 85.

The through-hole 81 has the square opening, and a part or whole of each of the conductive foils 60a and 60b in the current carrying region 62 is exposed from the opening of the through-hole 81 when the frame body 70 is attached to the organic EL device 3.

The base member 71 will be described below.

Figure 21:
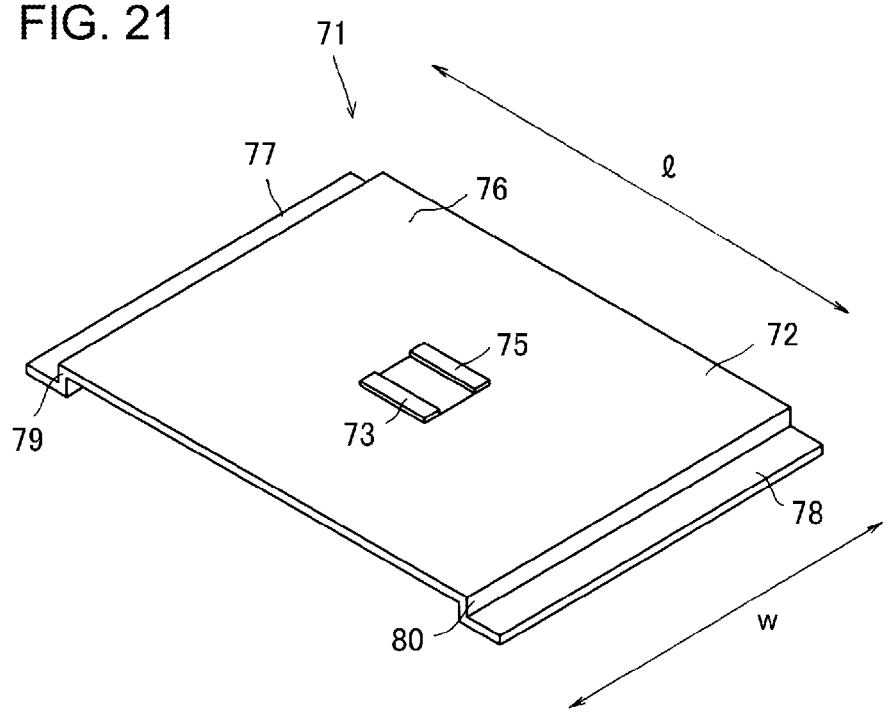
FIG. 21 is a perspective view of a base member in FIG. 15 when the base member is viewed from another direction (lower side).

As illustrated in FIGS. 15 and 21, the base member 71 is constructed with a support member 72, the mounting unit 5, and current carrying terminals 73 and 75.

As illustrated in FIG. 21, the support member 72 is constructed with a main body unit 76, attaching units 77 and 78, and connecting units 79 and 80 that connect the main body unit 76 and the attaching units 77 and 78. As illustrated in FIGS. 15 and 21, the main body unit 76 protrudes toward a thickness direction (vertical direction) with respect to the attaching units 77 and 78.

As illustrated in FIG. 21, the main body unit 76 and the attaching unit 77 are continuously provided in a stepwise manner with the connecting unit 79 interposed therebetween. Similarly, the main body unit 76 and the attaching unit 78 are continuously provided in the stepwise manner with the connecting unit 80 interposed therebetween.

The attaching units 77 and 78 can be attached to wall surfaces (attaching target surface) such as the ceiling in FIG. 14 by well-known tightening elements such as screws.

As illustrated in FIG. 15, the connector units 10a to 10d are provided in the mounting unit 5. The connector units 10a to 10d are electrically connected to the current carrying terminals 73 and 75 (see FIG. 21) through the mounting unit 5. As illustrated in FIG. 15, the connector units 10a to 10d are provided above the support member 72. On the other hand, as illustrated in FIG. 21, the current carrying terminals 73 and 75 are provided below the support member 72.

Figure 22:
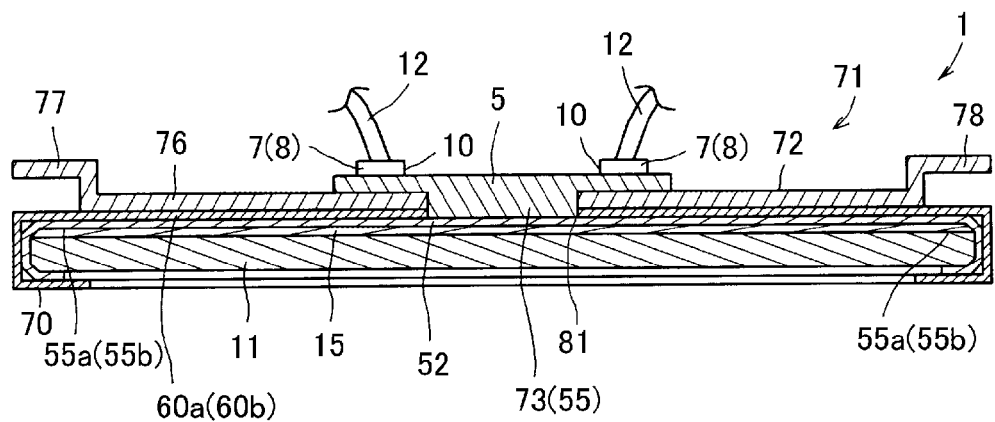
FIG. 22 is a sectional view of the organic EL module in FIG. 14.

As illustrated in FIG. 22, when the organic EL module 1 is attached to the wall surface, the current carrying terminals 73 and 75 come into contact with the conductive foils 60a and 60b located in the current carrying region 62 of the conductive member 52, and electrically connect the feeding units 55a and 55b of the organic EL device 3 and the mounting unit 5 in the organic EL module 1. That is, the support member 72 is inserted in the current carrying terminals 73 and 75 in the thickness direction, and the current carrying terminals 73 and 75 can physically be connected to the conductive member 52.

A positional relationship among the components of the organic EL module 1 will be described below along a typical procedure to assemble the organic EL module 1.

The conductive member 52 is attached to the organic EL device 3 to unify the organic EL device 3 and the conductive member 52. The frame body 70 is attached so as to cover the edge of the unified organic EL device 3 and conductive member 52.

Specifically, using the elasticity and flexibility of the frame body 70, the frame body 70 is spread (expanded) so as to become greater than an outer shape of the organic EL device 3, and the edge of the organic EL device 3 is fitted in the fixed space 87 of the frame body 70.

By the elasticity of the frame body 70, the organic EL device 3 is always biased so as to be in close contact with the conductive member 52. Therefore, in the organic EL module 1, the conductive member 52 can be prevented from separating from the organic EL device 3.

In the organic EL module 1, the frame body 70 having the elasticity and flexibility is spread to fit the organic EL device 3 in the fixed space 87, and the organic EL device 3 is pressed by a restoration force of the frame body 70. Therefore, the frame body 70 is hardly dropped out from the organic EL device 3.

As illustrated in FIG. 22, the current carrying terminals 73 and 75 of the base member 71 is brought into contact with the conductive foils 60a and 60b located in the current carrying region 62 of the conductive member 52, and the frame body 70 is fixed to the base member 71. That is, the current carrying terminals 73 and 75 are in contact with the conductive foils 60a and 60b via the through-hole 81 of the frame body 70.

A current flow that is expected in the case where the current is supplied from the external power supply to the organic EL module 1 of the first example will be described below.

The current supplied from the external power supply is carried from the first feeding terminal 7 of the connector unit 10, and carried to the current carrying terminal 73 via the mounting unit 5. The current carried to the current carrying terminal 73 is carried from the current carrying terminal 73 to the conductive foil 60a via the current carrying region 62 of the conductive member 52, and carried to the feeding unit 55a of the organic EL device 3. The current is carried from the feeding unit 55a to the first electrode layer 16 in the organic EL device 3.

The current carried to the first electrode layer 16 in the organic EL device 3 reaches the second electrode layer 18 via the functional layer 17 in the organic EL device 3. At this point, the light emitting layer in the functional layer 17 emits the light.

The current carries to the second electrode layer 18 in the organic EL device 3 is carried to the conductive foil 60b via the feeding unit 55b and the conductive region 63 of the conductive member 52, and carried from the current carrying region 62 of the conductive member 52 to the current carrying terminal 75. The current carried to the current carrying terminal 75 is carried from the current carrying terminal 75 to the second feeding terminal 8 of the connector unit 10 via the mounting unit 5.

Thus, the voltage can be applied to the functional layer 17 in the organic EL device 3 of the organic EL module 1 by connecting the connecting member 12 to the connector unit 10, and the light emitted from the functional layer 17 is transmitted through the first electrode layer 16 and the substrate 11 to become luminous in the light emitting surface 53.

The present invention will be described below with an organic EL module 201 as a second example, different from the first example.

Similarly to the first example, the organic EL module 201 can be laid without gaps with a planar expanse together with the plurality of organic EL modules 201.

Figure 23:
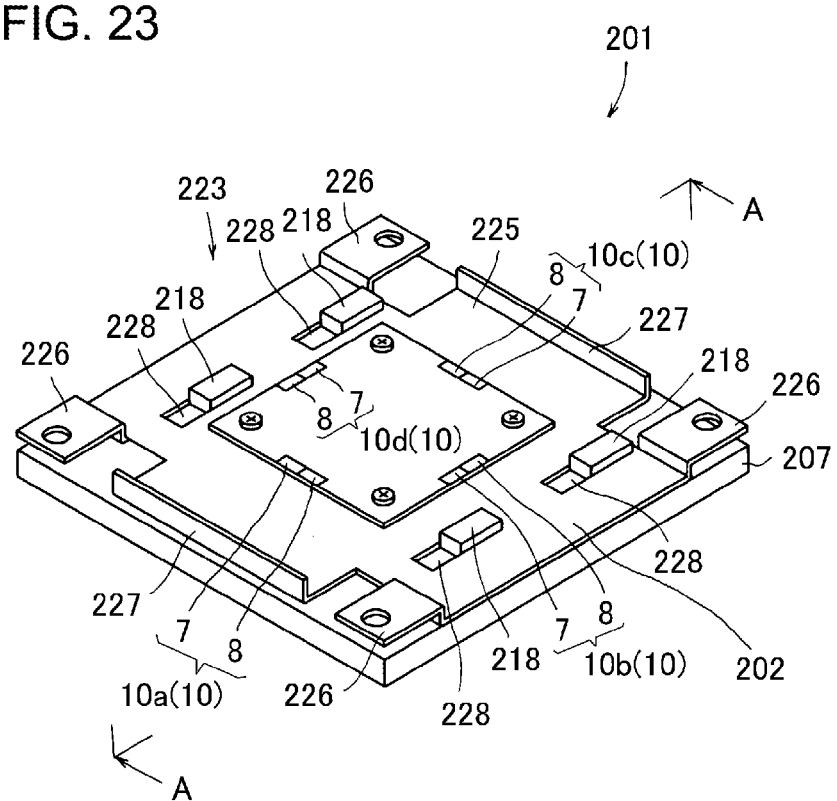
FIG. 23 is a perspective view of an organic EL module according to a second example of the present invention when the organic EL module is viewed from an upper side.
Figure 24:
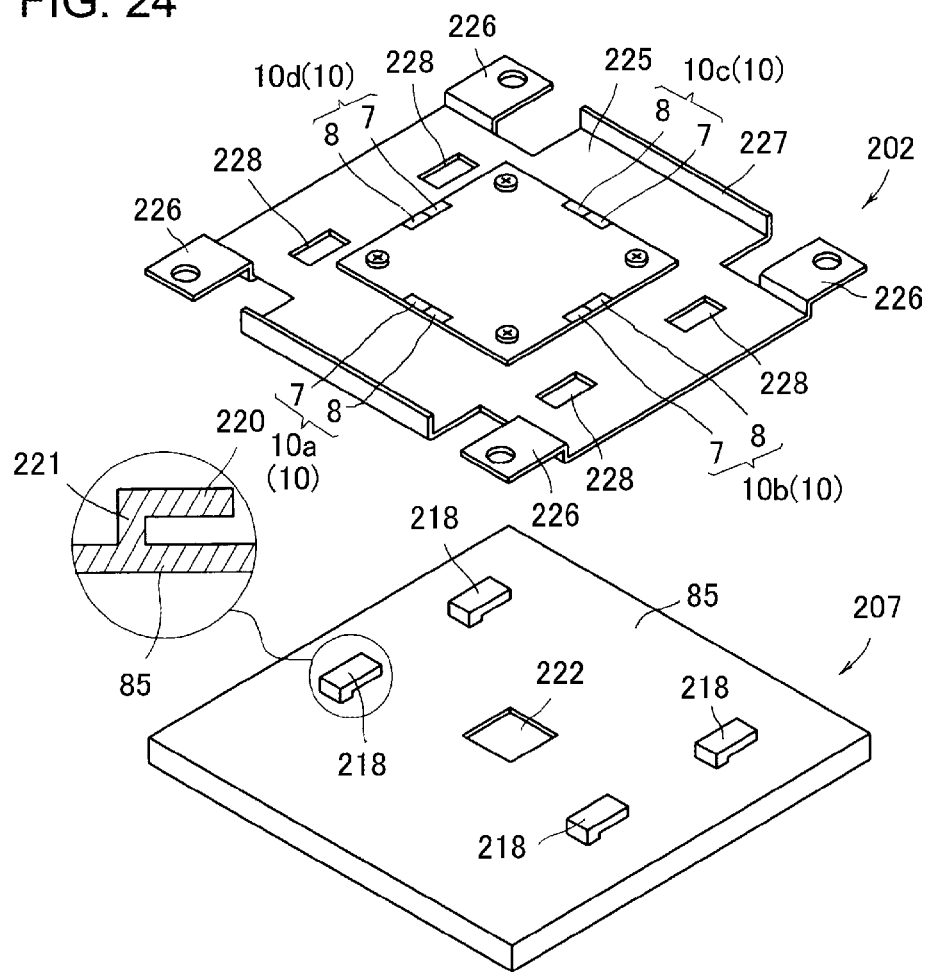
FIG. 24 is an exploded perspective view of the organic EL module in FIG. 23.
Figure 25:
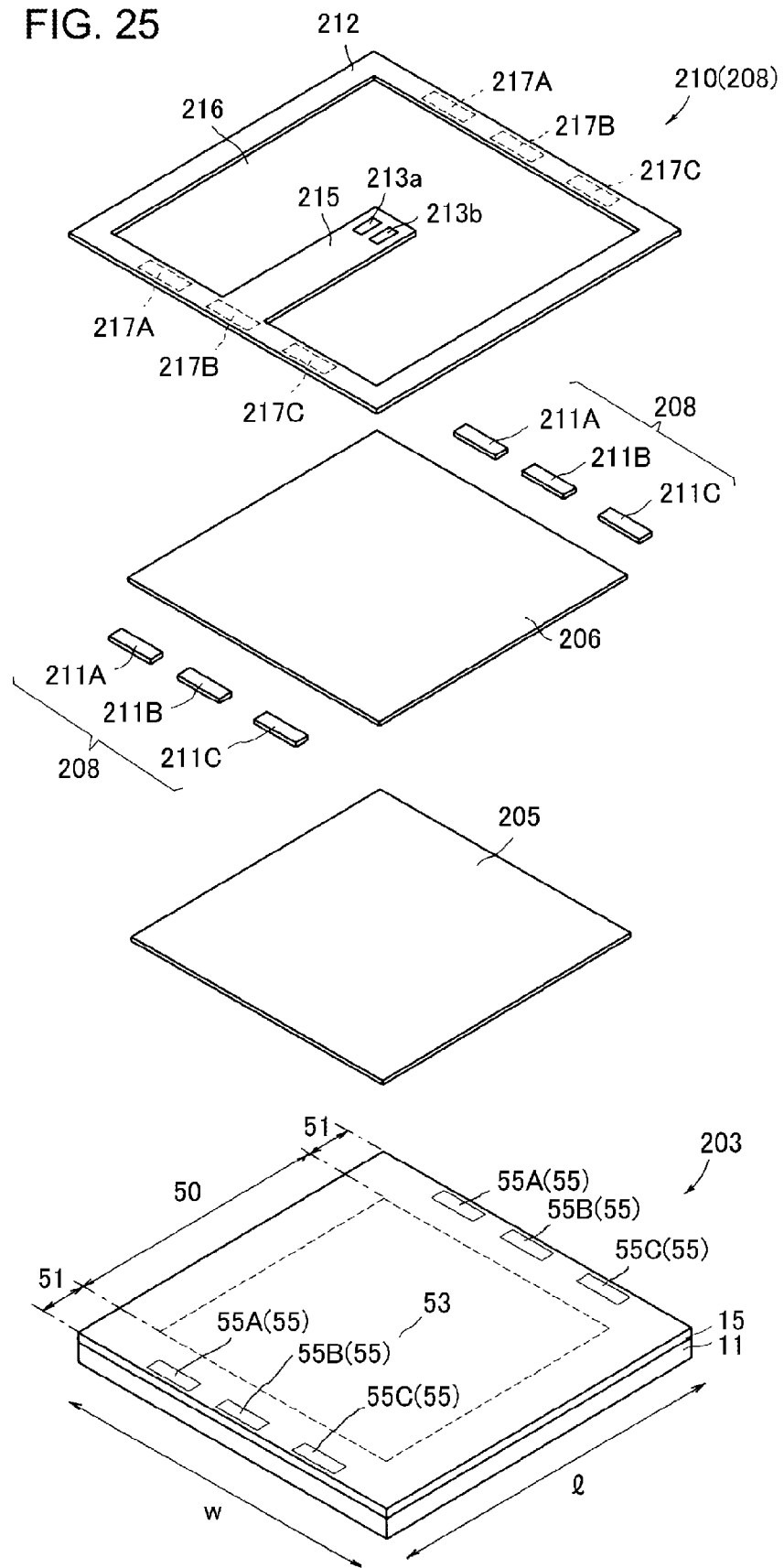
FIG. 25 is an exploded perspective view in which a main part in FIG. 24 is exploded into an organic EL device, a current carrying member, a heat equalizing member, and a buffer plate.

As illustrated in FIGS. 23, 24, and 25, the organic EL module 201 includes a base member 202, an organic EL device 203, a heat equalizing member 205, a buffer plate 206, a current carrying member 208, and a frame body 207.

A configuration of each member will be described below. The organic EL device 203 of the second example has the configuration similar to that of the organic EL device 3 of the first example. As illustrated in FIG. 25, the organic EL device 203 of the second example differs from the organic EL device 3 of the first example in the number of feeding units 55.

Specifically, as illustrated in FIG. 25, in the organic EL device 203 of the second example, a total of six feeding units 55, namely, three feeding units 55A to 55C are included in one side, and three feeding units 55A to 55C are included in the opposite side.

In the organic EL device 203, the feeding units 55A and 55C electrically connected to the first electrode layer 16 in the organic EL element 15 are arranged on both end sides in the width direction w of the substrate 11, and the feeding unit 55B electrically connected to the second electrode layer 18 is arranged inside the feeding units 55A and 55C. That is, the feeding units 55A, 55B, and 55C are sequentially arranged in the width direction w of the substrate 11.

On the other hand, in the organic EL device 203, the feeding units 55 and 55 that are opposed to each other with the light emitting region 50 sandwiched therebetween are connected to the identical electrode layer in the lengthwise direction 1 (the direction orthogonal to the width direction w) of the substrate 11.

Specifically, in the organic EL device 203, the feeding units 55A and 55A and the feeding units 55C and 55C are electrically connected to the first electrode layer 16 in the organic EL element 15, and the feeding units 55B and 55B are electrically connected to the second electrode layer 18 in the organic EL element 15.

The heat equalizing member 205 will be described below.

The heat equalizing member 205 is a sheet-like or plate-like body having a planar expanse, and preferably the heat equalizing member 205 is a square sheet.

Preferably the heat equalizing member 205 has a size that covers the whole light emitting region 50 of the organic EL device 203.

Preferably the heat equalizing member 205 has thicknesses between 50 µm and 1 mm inclusive. More preferably the heat equalizing member 205 has thicknesses between 70 µm and 500 µm inclusive, and particularly preferably has thicknesses between 100 µm and 300 µm inclusive.

When the thickness of the heat equalizing member 205 falls within the above range, the heat equalizing member 205 can exert a radiation function and a heat equalizing function. When the thickness of the heat equalizing member 205 falls within the above range, the heat equalizing member 205 is not too thick.

There is no particular limitation to a material for the heat equalizing member 205 as long as the material has high heat conductivity. For example, graphite, ceramic, metal, and an inorganic compound can be used as the material for the heat equalizing member 205. Particularly, as to the metal, copper, aluminum, iron, nickel, chromium, tin, brass, stainless steel can be cited as an example of the material for the heat equalizing member 205. Particularly preferably a graphite sheet and an aluminum foil are used from the viewpoint of a radiation property and a heat equalizing property.

The buffer plate 206 will be described below. As illustrated in FIGS. 24 and 25, the buffer plate 206 is interposed between the connecting unit 215 of a conductive member 210 and the heat equalizing member 205 when the organic EL module 201 is assembled, and relaxes a pressing force of the conductive member 210 on the organic EL device 203.

There is no particular limitation to a material for the buffer plate 206 as long as the material has such a degree of rigidity that an elastic deformation is not generated when the organic EL module 201 is assembled. For example, an insulating resin and a metallic plate covered with an insulating film can be used as the material for the buffer plate 206. For the resin buffer plate 206, preferably the thickness ranges between 0.3 mm and 2 mm inclusive. For the metallic buffer plate 206, preferably the thickness ranges between 0.05 mm and 1 mm inclusive, more preferably ranges between 0.1 mm and 0.5 mm inclusive.

Preferably the buffer plate 206 is made of a material in which an external force received by one surface is not directly transmitted to the surface on the opposite side when the organic EL module 201 is assembled.

The current carrying member 208 will be described below. The current carrying member 208 electrically connects the current carrying terminals 73 and 75 (see FIG. 26) of the base member 202 and the feeding units 55A to 55C (see FIG. 25) of the organic EL device 203.

As illustrated in FIG. 25, the current carrying member 208 is constructed with the conductive member 210 and bonding members 211A to 211C that connect the conductive member 210 and the feeding unit 55 of the organic EL device 203.

The conductive member 210 is constructed with a flexible printed circuit board (FPC), and subjected to predetermined patterning.

Specifically, the conductive member 210 includes at least a pattern that electrically connects the current carrying terminal 73 (see FIG. 26) of the base member 202 and the feeding units 55A and 55C and a pattern that electrically connects the current carrying terminal 75 (see FIG. 26) of the base member 202 and the feeding unit 55B.

As illustrated in FIG. 25, the conductive member 210 includes a cyclic unit 212 and a connecting unit 215.

The cyclic unit 212 has a square cyclic shape in a planar view (when viewed from the side of the base member 202), and covers upper portions of the feeding units 55A to 55C of the organic EL device 203 as illustrated in FIG. 24.

That is, as illustrated in FIG. 24, the cyclic unit 212 is placed along each side of the organic EL device 203, and includes an opening 216 on the inside thereof. As illustrated in FIG. 25, the opening 216 has the square shape, and the size of the opening is slightly larger than the buffer plate 206 such that the buffer plate 206 can be accommodated in the opening.

As illustrated in FIG. 25, the cyclic unit 212 includes ground units 217A to 217C in the side extending in the width direction w. The ground units 217A and 217C are electrically connected to a terminal unit 213a of a connecting unit 215, and the ground unit 217B is electrically connected to a terminal unit 213b of the connecting unit 215.

As illustrated in FIG. 25, the connecting unit 215 is a tongue-shaped region that extends from the center in the width direction w of one side of the cyclic unit 212 toward a cyclic center (the center in the lengthwise direction 1) of the cyclic unit 212. The connecting unit 215 includes terminal units 213a and 213b near a leading end in the direction extending from the cyclic unit 212. In other words, when the organic EL module 201 is assembled, the connecting unit 215 extends in the lengthwise direction 1 of the organic EL device 203, and extends toward the center side of the light emitting surface 53.

The terminal units 213a and 213b are arrayed in the width direction w of the organic EL device 203, and can come into contact with the current carrying terminals 73 and 75 (see FIG. 26) of the base member 202.

As illustrated in FIG. 25, the bonding members 211A to 211C bonds and electrically connects the feeding units 55A to 55C of the organic EL device 203 to the ground units 217A to 217C. The bonding member 211A to 211C are arranged at predetermined intervals in the width direction w.

There is no particular limitation to a material for the bonding members 211A to 211C, as long as the material has a bonding property and the electric conductivity. For example, conductive bonding materials such as an anisotropic conductive film (ACF) and low-temperature solder can be used.

Figure 27:
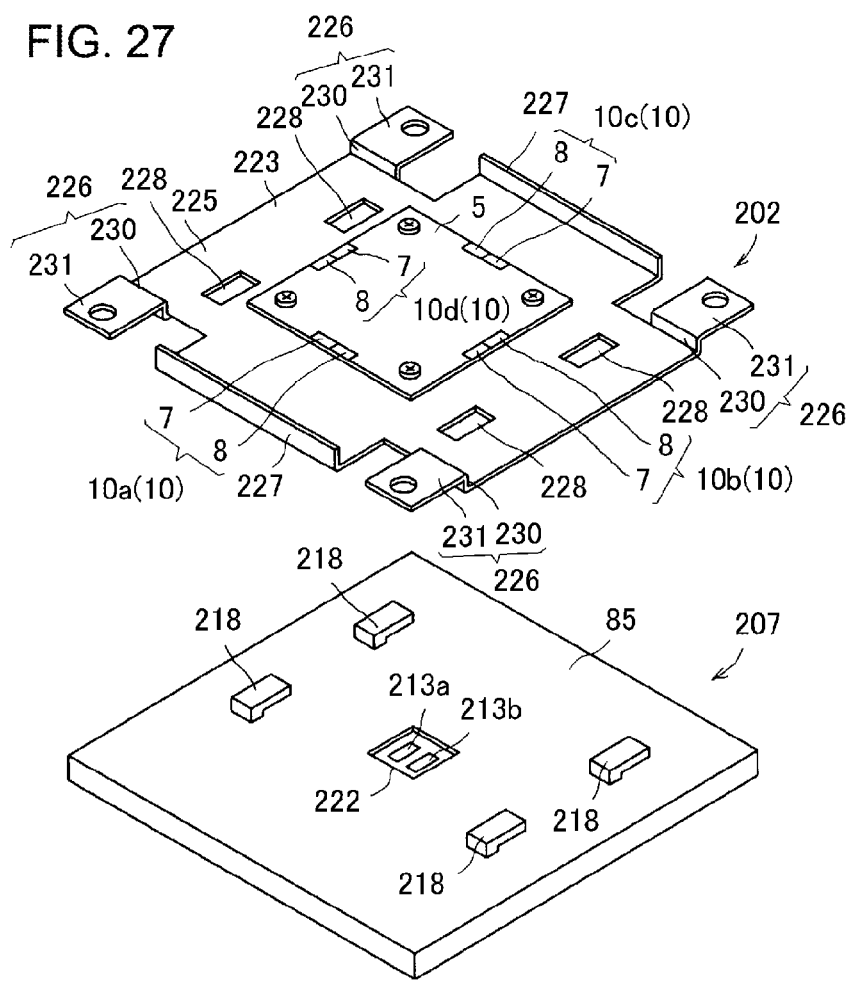
FIG. 27 is an exploded perspective view of the organic EL module in FIG. 24.
Figure 28:
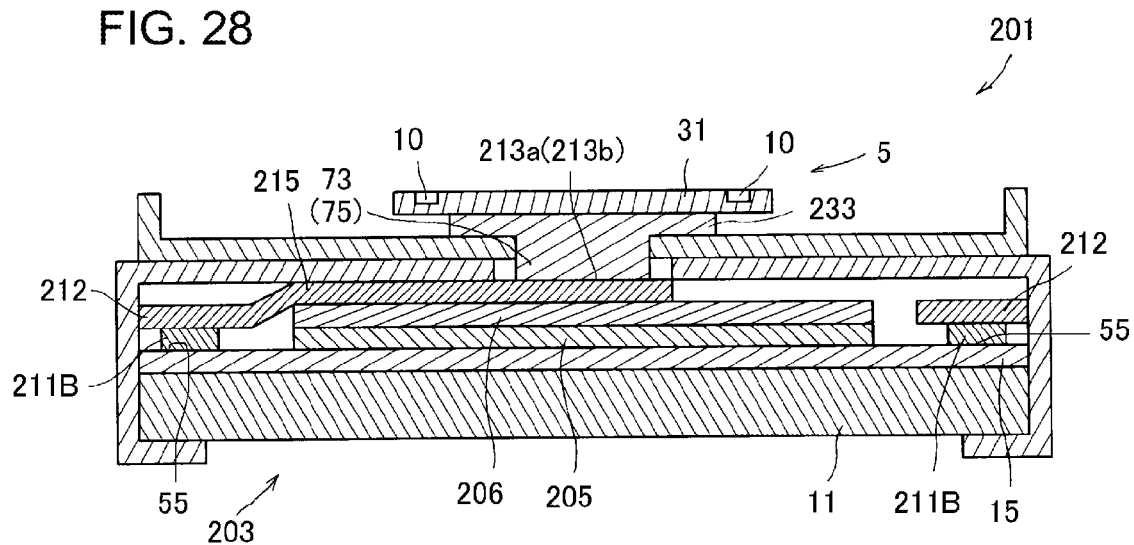
FIG. 28 is a sectional view taken along a line A-A of the organic EL module in FIG. 23.

The frame body 207 will be described below. As illustrated in FIGS. 27 and 28, the frame body 207 is a frame-shaped member that covers the outer peripheral edge of the organic EL device 203, and the frame body 207 has the configuration substantially similar to that of the frame body 70 of the first example. Specifically, the frame body 207 includes a latching piece 218 that can be latched in the base member 202 in addition to the configuration of the frame body 70 of the first example.

As illustrated in FIGS. 24 and 27, the latching piece 218 is provided on the surface of the organic-EL-element-side covering unit 85 with a distribution. As illustrated in FIG. 24, the latching piece 218 includes a hook unit 220 and a connecting unit 221 that connects the hook unit 220 and the organic-EL-element-side covering unit 85.

The connecting unit 221 protrudes in the direction (member thickness direction) orthogonal to the top surface of the organic-EL-element-side covering unit 85. The hook unit 220 protrudes from the end portion in the projection direction of the connecting unit 221 so as to be parallel to the top surface of the organic-EL-element-side covering unit 85.

The protrusion directions of the hook units 220 are oriented toward the identical direction. Specifically, the protrusion directions of the hook units 220 are oriented toward the extending direction 1 of the connecting unit 215 in the conductive member 210 of the current carrying member 208 when the organic EL module 201 is assembled.

As illustrated in FIG. 27, in the frame body 207, a through-hole 222 is located at the position corresponding to the terminal units 213a and 213b when the frame body 207 is attached to the organic EL device 203.

Specifically, the through-hole 222 is provided in the center of the organic-EL-element-side covering unit 85. The through-hole 222 has the square opening.
When the frame body 207 is attached to the organic EL device 203, the terminal units 213a and 213b are exposed in the opening of the frame body 207. Therefore, the current carrying terminals 73 and 75 (see FIG. 26) of the base member 202 can come into contact with the terminal units 213a and 213b via the through-hole 222, and be electrically connected to the terminal units 213a and 213b.

The base member 202 will be described below.

Figure 26:
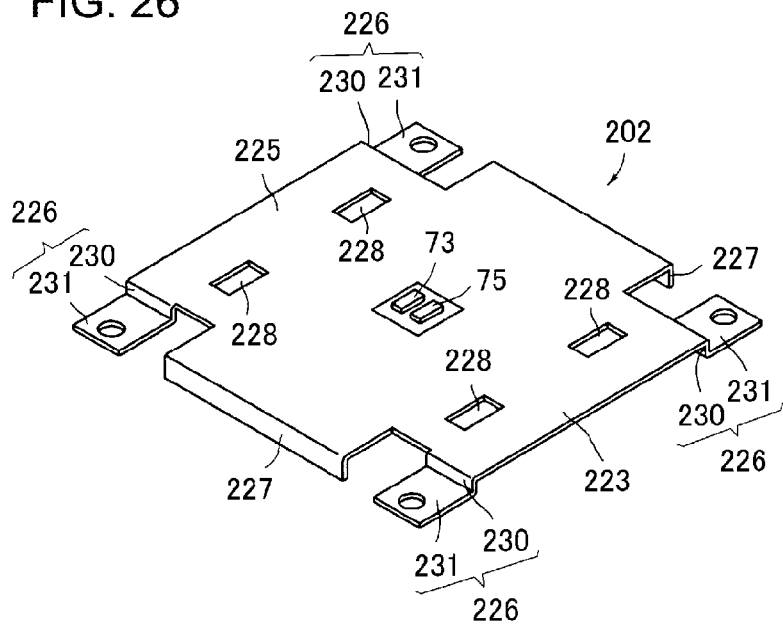
FIG. 26 is a perspective view of a base member in FIG. 24 when the base member is viewed from a bottom surface side.

As illustrated in FIGS. 26 and 27, the base member 202 is constructed with a framework unit 223, the mounting unit 5, and the current carrying terminals 73 and 75.

The framework unit 223 is formed by folding a plate material. The framework unit 223 includes a main body unit 225, an attaching unit 226 that can be attached to wall surfaces such as a ceiling, and a reinforcing unit 227 that enhance the rigidity of the framework unit 223.

As illustrated in FIG. 27, the mounting unit 5 is attached to the center of the main body unit 225, and the main body unit 225 includes a plurality of fixing holes 228 outside the mounting unit 5.

Specifically, as illustrated in FIG. 23, when the frame body 207 is attached to the base member 202, the four fixing holes 228 are provided on the outside in the width direction of the mounting unit 5 and at the positions corresponding to the latching pieces 218 of the frame body 207. The fixing hole 228 can engage the corresponding latching piece 218.

As illustrated in FIG. 27, the attaching units 226 are provided at four corners of the main body unit 225 when the base member 202 is viewed in a planar manner. The attaching unit 226 is constructed with a vertical wall unit 230 that is folded upward from the main body unit 225 and an attaching surface 231 that is folded in parallel to the main body unit 225 from the leading end in the folding direction (member thickness direction) of the vertical wall unit 230.

When being attached to wall surfaces such as a ceiling, the attaching surface 231 is in contact with the wall surfaces such as the ceiling. A hole in which well-known tightening elements such as a bolt can be inserted is provided in the center of the attaching surface 231. That is, the attaching unit 226 has a function of attaching the organic EL module 1 to the wall surfaces such as the ceiling using the well-known tightening elements.

The attaching unit 226 differs from the main body unit 225 in height, and also has a interval maintaining function of maintaining a predetermined interval between the circuit board 31 of the mounting unit 5 and the wall surfaces (attaching target surfaces) such as the ceiling. Therefore, the circuit board 31 of the mounting unit 5 is not compressed by the attaching target surface.

The reinforcing units 227 are provided at both ends in the lengthwise direction 1 of the main body unit 225. The reinforcing unit 227 is a folded region that is folded upward from the main body unit 225.

At this point, the mounting unit 5 will be described in detail. As illustrated in FIG. 28, the mounting unit 5 is constructed with the circuit board 31 and a circuit unit 233 such as the DC stabilizing circuit, and the circuit unit 233 concentrates on one of the principal surface sides of the circuit board 31.

When the mounting unit 5 is attached to the framework unit 223 to form the base member 202, the surface of the circuit board 31 to which the circuit unit 233 is mainly attached is opposed to the top surface of the main body unit 225 as illustrated in FIG. 28. The main body unit 225 and the circuit board 31 are arranged with a predetermined space, and the circuit unit 233 is accommodated in the predetermined space. The connector unit 10 is provided on the surface of the circuit board 31 on the side opposite to the surface to which the circuit unit 233 is mainly attached.

A positional relationship among the components of the organic EL module 201 will be described below along a typical procedure to assemble the organic EL module 201.

The heat equalizing member 205 is placed on the organic EL device 203, and the buffer plate 206 is placed on the heat equalizing member 205.

At this point, the heat equalizing member 205 covers a part or whole of the light emitting surface 53 of the organic EL device 203. The heat equalizing member 205 does not cover the feeding units 55A to 55C. In other words, the feeding units 55A to 55C are exposed from the heat equalizing member 205.

Then the ground units 217A to 217C of the conductive member 210 are connected to the feeding units 55A to 55C of the organic EL device 203 via the bonding members 211A to 211C (current carrying member 208).

At this point, the cyclic unit 212 of the conductive member 210 is located above the organic EL device 203 and outside the buffer plate 206. The buffer plate 206 and heat equalizing member 205, and the cyclic unit 212 and bonding members 211A to 211C, are arranged with a predetermined gap as illustrated in FIG. 28. That is, the buffer plate 206 and the heat equalizing member 205 are in contact with neither the cyclic unit 212 nor bonding members 211A to 211C.

As illustrated in FIG. 24, the tongue-shape connecting unit 215 is placed on the buffer plate 206. The terminal units 213a and 213b of the connecting unit 215 are located in the centers of the width direction w and lengthwise direction 1 of the organic EL device 203.

Then the frame body 207 is attached so as to cover the edges of the unified organic EL device 203 and current carrying member 208 (the cyclic unit 212 of the conductive member 210) for the unification of these components. Specifically, using the elasticity and flexibility of the frame body 207, the frame body 207 is spread (expanded) so as to become greater than the outer shape of the organic EL device 203, and the edge of the organic EL device 203 is fitted in the fixed space 87 of the frame body 207.

At this point, the organic EL device 203 is always biased by the elasticity of the frame body 207 so as to be in close contact with the conductive member 210. Therefore, in the organic EL module 201, the conductive member 210 can be prevented from separating from the organic EL device 203.

Then, through another process, the frame body 207 is attached to the base member 202 attached to wall surfaces such as a ceiling. Specifically, the latching piece 218 of the frame body 207 is slid and inserted in the fixing hole 228 of the base member 202, and the latching unit 214 is latched in the main body unit 225 of the base member 202.

At this point, the current carrying terminals 73 and 75 come into contact with the terminal units 213a and 213b, and the current carrying terminals 73 and 75 are fixed while pressing the terminal units 213a and 213b.

In the organic EL module 201 of the second example, as described above, because the buffer plate 206 is interposed between the organic EL device 203 and the connecting unit 215, the pressing force applied to the organic EL device 203 is relaxed, but the pressing forces of the current carrying terminal 73 and 75 are not transmitted to the organic EL device 203. Therefore, the organic EL element 5 in the organic EL device 203 is not compressed, but the short circuit hardly occurs.

In the configuration of the organic EL module 201 of the second example, because the buffer plate 206 is placed on the heat equalizing member 205 in the organic EL device 203, the heat generated in the organic EL device 203 during the operation is equalized by the heat equalizing member 205, and escapes via the heat buffer plate 206. Therefore, the heat hardly remains in the organic EL device 203, but the heat does not locally concentrate. Accordingly, an emission defect is hardly generated.

In the configuration of the organic EL module 201 of the second example, the frame body 207 and the base member 202 are unified by latching the latching piece 218 of the frame body 207 in the fixing hole 228 of the base member 202, so that the frame body 207 can be detachably attached to the base member 202.

A current flow that is expected in the case where the current is supplied from the external power supply to the organic EL module 201 of the second example will be described below.

The current supplied from the external power supply is carried from the first feeding terminal 7 of the supply connector unit 10, and carried to the current carrying terminal 73 via the circuit unit 233 of the mounting unit 5. The current carried to the current carrying terminal 73 is carried to the cyclic unit 212 via the terminal unit 213a of the connecting unit 215 of the conductive member 210, and carried to the feeding units 55A and 55C of the organic EL device 203 via the ground units 217A and 217C. The current carried to the feeding units 55A and 55C is carried to the first electrode layer 16 in the organic EL device 203.

The current carried to the first electrode layer 16 in the organic EL device 3 reaches the second electrode layer 18 via the functional layer 17 in the organic EL device 203. At this point, the light emitting layer in the functional layer 17 emits the light.

The current carried to the second electrode layer 18 in the organic EL device 3 is carried to the cyclic unit 212 of the conductive member 210 via the feeding unit 55B and the ground unit 217B, and carried from the connecting unit 215 of the conductive member 210 to the terminal unit 213b. The current carried to the terminal unit 213b is carried to the second feeding terminal 8 of the connector unit 10 via the current carrying terminal 75 and the circuit unit 233 of the mounting unit 5.

Thus, the voltage can be applied to the organic EL device 203 in the organic EL device 201 by connecting the connecting member 12 to the connector unit 10, and the light emitting surface 53 of the organic EL device 203 can become luminous.

In the first and second examples, by way of example, the connector unit 10 includes only the feeding terminals 7 and 8, but the present invention is not limited to this. Alternatively, the connector unit 10 may include a signal terminal in the case where the mounting unit 5 includes a light control circuit. In this case, preferably a signal line is included in the connecting member 12.

REFERENCE SIGNS LIST 1, 1a to 1d, 1A to 1I organic EL module
2 connecting plate (base member)
3, 3a to 3d, 3A to 3I organic EL device
5 mounting unit
7 first feeding terminal (feeding terminal)
8 second feeding terminal (feeding terminal)
10, 10a to 10d connector unit
11 substrate
12 connecting member
16 first electrode layer (electrode)
17 functional layer (organic light emitting layer)
18 second electrode layer (electrode)
30 circuit structure
31 circuit board
32 circuit region (current-carrying-terminal-side connecting wiring)
33 positive region (connector-side connecting wiring)
35 negative region (connector-side connecting wiring)
50 light emitting region
52, 210 conductive member
53 light emitting surface
55, 55a, 55b, 55A to 55C feeding unit
60, 60a, 60b conductive foil
61 resin film
62 current carrying region
70, 207 frame body
71, 202 base member
73 current carrying terminal
76 main body unit
87 fixed space (space)
100, 200 feeding structure of organic EL module
205 heat equalizing member
206 buffer plate
212 cyclic unit
213a, 213b terminal unit
215 connecting unit
233 circuit unit

The invention claimed is:

1. An organic EL module comprising: an organic EL device in which at least one of planes constitutes a light emitting surface; and at least three connector units that are arranged on a back side of the light emitting surface, wherein
    two electrode layers and an organic light emitting layer sandwiched between the electrode layers are stacked on a substrate having a planar expanse in the organic EL device,
    the connector units are arranged with a planar expanse,
    each of the connector units includes at least a feeding terminal, and
    the feeding terminals are electrically connected in parallel to one another and electrically connected to the two electrode layers
    the organic EL module further comprising a base member that includes the connector units, wherein
    the base member is arranged on a projection plane in a member thickness direction of the organic EL device.

2. The organic EL module according to claim 1, further comprising a base member that includes the connector units, wherein
    the base member has a shape in which the base members can be laid without gaps with a planar expanse, and
    the same number of the connector units as the other adjacent organic EL modules are provided when the base members are laid without gaps,
    wherein the base member has a polygonal shape in a planar view, and the connector unit is arranged according to each side of the polygonal shape, and
    wherein the base member is arranged on a projection plane in a member thickness direction of the organic EL device.

3. The organic EL module according to claim 1, further comprising: a plurality of a split flow pathways that splits a current supplied from one of the connector units to another of the connector units when the current is supplied to the one of the connector units; and a self conductive pathway through which the current is supplied to the self organic EL device.

4. The organic EL module according to claim 1, further comprising:
a base member that fixes the organic EL device to an attaching target surface, the base member including a current carrying terminal on a side of the light emitting surface, the current carrying terminal being electrically connected to the organic EL device and the two electrode layers; and
a mounting unit that has a circuit structure, the circuit structure including a mounting circuit and a current-carrying-terminal-side connecting wiring that electrically connects the mounting circuit and the current carrying terminal, wherein
the current-carrying-terminal-side connecting wiring has a planar expanse.

5. The organic EL module according to claim 1, further comprising a base member, wherein
the base member includes a mounting unit and a main body unit on which the mounting unit is placed,
the mounting unit is constructed with a circuit board and a circuit unit,
the circuit unit concentrates on a side of one of principal surfaces of the circuit board, and
the one of the principal surfaces of the circuit board is opposed to the main body unit.

6. The organic EL module according to claim 5, wherein the main body unit and the circuit board are arranged with a predetermined space, and
the circuit unit is accommodated in the predetermined space, and
wherein the connector unit is provided on a surface on a side opposite to the one of the principal surfaces of the circuit board.

7. The organic EL module according to claim 1, wherein the organic EL device includes: at least two feeding units that are electrically connected to one of the two electrode layers; and
a conductive member that electrically connects the organic EL device and the connector unit, and
the conductive member connects at least two of the feeding units to each other, and
wherein, in the conductive member, a plurality of conductive foils are arranged in a planar manner, and resin films having insulating properties are provided on both sides of the plurality of conductive foils.

8. The organic EL module according to claim 1, wherein the organic EL device includes: at least two feeding units that are electrically connected to one of the two electrode layers; and
a conductive member that electrically connects the organic EL device and the connector unit, and
the conductive member connects at least two of the feeding units to each other, and
wherein the conductive member is placed on a surface on a side opposite to the light emitting surface of the organic EL device,
and traverses the surface on the side opposite to the light emitting surface.

9. The organic EL module according to claim 1, wherein the organic EL device includes: at least two feeding units that are electrically connected to one of the two electrode layers; and
a conductive member that electrically connects the organic EL device and the connector unit, and
the conductive member connects at least two of the feeding units to each other, and
wherein the organic EL device includes a light emitting region that actually emits light during operation when the substrate is viewed in a planar manner,
the conductive member includes a cyclic unit that surrounds the light emitting region of the organic EL device and a connecting unit that extends from the cyclic unit into the light emitting region,
the cyclic unit is connected to each of the feeding units,
the connecting unit includes a terminal unit that is directly or indirectly connected to the base member in the light emitting region, and
the organic EL device and the connector unit are electrically connected to each other via the terminal unit.

10. The organic EL module according to claim 9, wherein the terminal unit is located near a leading end in an extending direction of the connecting unit, and located in the center of the light emitting region, and
the organic EL module further comprising a sheet-like or plate-like heat equalizing member that has heat conductivity, the heat equalizing member covering the whole light emitting region of the organic EL device.

11. The organic EL module according to claim 9, further comprising a buffer plate that covers the whole light emitting region of the organic EL device, the buffer plate relaxing a pressure applied onto the organic EL device side, and
wherein the buffer plate is interposed between the connecting unit and the organic EL device.

12. The organic EL module according to claim 1, further comprising:
a conductive member that electrically connects the organic EL device and the connector unit; and
a frame body that can be attached to the organic EL device, the frame body unifying the conductive member and the organic EL device, and
wherein the frame body includes an organic-EL-element-side covering unit that covers a surface on a side opposite to the light emitting surface of the organic EL device,
the organic-EL-element-side covering unit includes a through-hole that penetrates the organic-EL-element-side covering unit in a member thickness direction, and
the conductive member passes through an opening on the connector side of the through-hole.

13. An organic-EL-module feeding structure comprising: at least three of the organic EL modules according to claim 1; and a connecting member that electrically connects connector units of the organic EL modules, wherein
at least two closed circuits passing through an external power supply, a connecting member, and an organic EL device having a load of an organic light emitting layer are formed between the organic EL modules.

14. The organic-EL-module feeding structure according to claim 13, wherein the at least three organic EL modules comprise a base member that includes the connector units, and
wherein base members of the at least three organic EL modules are arranged so as to be densely laid with a planar expanse.

15. The organic-EL-module feeding structure according to claim 13, wherein the two closed circuits pass through the different organic EL modules,
wherein one of the organic EL modules forms a first closed circuit passing through the organic EL device having the load of the self organic light emitting layer and a second closed circuit passing through the organic EL device having the load of the organic light emitting layer of another organic EL module, and wherein the organic-EL-module feeding structure comprises a plurality of feeding pathways through which power is fed from the external power supply to one of the organic EL modules.

16. An organic EL module comprising: an organic EL device in which two electrode layers and an organic light emitting layer sandwiched between the electrode layers are stacked on a substrate having a planar expanse, at least one of planes of the organic EL device constituting a light emitting surface; and at least three connector units that are arranged on a back side of the light emitting surface; wherein the organic EL device includes a light emitting region that actually emits light during operation when the substrate is viewed in a planar manner, the organic EL device includes at least two feeding units that are electrically connected to one of the two electrode layers, the conductive member that electrically connects a feeding unit of the organic EL device and the connector unit is provided, the conductive member includes a cyclic unit that surrounds a light emitting region of the organic EL device and a connecting unit that extends from the cyclic unit into the light emitting region, the cyclic unit is connected to each of the feeding units, the connecting unit includes a terminal unit that is directly or indirectly connected to a base member in the light emitting region, and the organic EL device and the connector unit are electrically connected to each other via the terminal unit.

17. An organic-EL-module feeding structure comprising: at least three of the organic EL modules according to claim 16; and a connecting member that electrically connects connector units of the organic EL modules, wherein at least two closed circuits passing through an external power supply, a connecting member, and an organic EL device having a load of an organic light emitting layer are formed between the organic EL modules, wherein the at least three organic EL modules comprise a base member that includes the connector units, and wherein base members of the at least three organic EL modules are arranged so as to be densely laid with a planar expanse.

18. An organic-EL-module feeding structure comprising: at least three of organic EL modules; and a connecting member that electrically connects connector units of the organic EL modules, the organic EL module comprising: an organic EL device in which two electrode layers and an organic light emitting layer sandwiched between the electrode layers are stacked on a substrate having a planar expanse, at least one of planes of the organic EL device constituting a light emitting surface; and at least three connector units that are arranged on a back side of the light emitting surface wherein a mounting unit having a circuit structure is provided, the circuit structure includes a mounting circuit and a connector-side connecting wiring that electrically connects the mounting circuit and the connector unit, and the connector side connecting wiring has a planar expanse, wherein at least two closed circuits passing through an external power supply, a connecting member, and an organic EL device having a load of an organic light emitting layer are formed between the organic EL modules, wherein the at least three organic EL modules comprise a base member that includes the connector units, and wherein base members of the at least three organic EL modules are arranged so as to be densely laid with a planar expanse.

19. An organic-EL-module feeding structure comprising: at least three of organic EL modules; and a connecting member that electrically connects connector units of the organic EL modules, the organic EL module comprising: an organic EL device in which two electrode layers and an organic light emitting layer sandwiched between the electrode layers are stacked on a substrate having a planar expanse, at least one of planes of the organic EL device constituting a light emitting surface; and at least three connector units that are arranged on a back side of the light emitting surface wherein the organic EL device includes at least two feeding units that are electrically connected to one of the two electrode layers, a conductive member that electrically connects the organic EL device and the connector unit is provided, and the conductive member connects the two feeding units to each other, wherein at least two closed circuits passing through an external power supply, a connecting member, and an organic EL device having a load of an organic light emitting layer are formed between the organic EL modules, wherein the at least three organic EL modules comprise a base member that includes the connector units, and wherein base members of the at least three organic EL modules are arranged so as to be densely laid with a planar expanse.

* * * * *

UNITED STATES PATENT AND TRADEMARK OFFICE
CERTIFICATE OF CORRECTION

PATENT NO. : 9,307,585 B2
APPLICATION NO. : 14/394055
DATED : April 5, 2016
INVENTOR(S) : Nobuhito Miura It is certified that error appears in the above-identified patent and that said Letters Patent is hereby corrected as shown below:

In the claims, column 30, line 46, delete "layers" and insert --layers,--.

Signed and Sealed this
Seventh Day of June, 2016

Michelle K. Lee
*Director of the United States Patent and Trademark Office*